US012750034B2

(12) United States Patent
Nagatomo et al.

(10) Patent No.: US 12,750,034 B2
(45) Date of Patent: Sep. 29, 2026

(54) ACOUSTIC WAVE DEVICE

(71) Applicant: Murata Manufacturing Co., Ltd., Nagaokakyo (JP)

(72) Inventors: Sho Nagatomo, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 19/028,000

(22) Filed: Jan. 17, 2025

(65) Prior Publication Data

US 2025/0167760 A1 May 22, 2025

Related U.S. Application Data

(63) Continuation of application No. PCT/JP2023/030459, filed on Aug. 24, 2023.
(Continued)

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02015* (2013.01); *H03H 9/02228* (2013.01); *H03H 9/132* (2013.01); *H03H 9/566* (2013.01)

(58) Field of Classification Search
CPC .......... H03H 9/02; H03H 9/132; H03H 9/205; H03H 9/25; H03H 9/64
See application file for complete search history.

(56) References Cited

U.S. PATENT DOCUMENTS 3,866,154 A * 2/1975 Moore ............... H03H 9/14508 310/313 R
4,575,696 A * 3/1986 Hartmann .............. H03H 9/145 333/196
(Continued)

FOREIGN PATENT DOCUMENTS

JP H0774582 A 3/1995
JP H11186867 A 7/1999
(Continued)

OTHER PUBLICATIONS

International Search Report in PCT/JP2023/030459, mailed Oct. 24, 2023, 2 pages.
Written Opinion in PCT/JP2023/030459, mailed Oct. 24, 2023, 4 pages.

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes a first acoustic wave resonator including a first piezoelectric film, and at least one second acoustic wave resonator electrically connected to the first acoustic wave resonator. The first acoustic wave resonator includes a first comb-shaped electrode on a first piezoelectric layer and including first electrode fingers connected to an input potential, a second comb-shaped electrode on the first piezoelectric layer and including second electrode fingers interdigitated with the first electrode fingers, and connected to an output potential, and a third electrode connected to a potential different from those connected to the first and second comb-shaped electrodes, and including third electrode fingers, and a connection electrode connecting adjacent third electrode fingers. The second acoustic wave resonator includes fourth and fifth electrode fingers interdigitated with each other. The second acoustic wave
(Continued)

resonator is a series arm resonator or a parallel arm resonator.

19 Claims, 14 Drawing Sheets

Related U.S. Application Data

(60) Provisional application No. 63/400,912, filed on Aug. 25, 2022.

(51) Int. Cl.
*H03H 9/13* (2006.01)
*H03H 9/56* (2006.01)

(56) References Cited

U.S. PATENT DOCUMENTS

| | | | | | |
|---|---|---|---|---|---|
| 5,729,076 | A * | 3/1998 | Yamada | H03H 9/14597 310/317 |
| 6,127,904 | A * | 10/2000 | Tanaka | H03H 9/0042 310/313 C |
| 10,491,192 | B1 | 11/2019 | Plesski et al. | |
| 11,110,493 | B2 * | 9/2021 | Tombs | H02S 40/10 |
| 2022/0123727 | A1 | 4/2022 | Reinhardt et al. | |
| 2023/0370047 | A1 | 11/2023 | Ishii | |

FOREIGN PATENT DOCUMENTS

| | | | |
|---|---|---|---|
| JP | 2022067077 | A | 5/2022 |
| WO | 2022163865 | A1 | 8/2022 |

* cited by examiner

ACOUSTIC WAVE DEVICE

CROSS REFERENCE TO RELATED APPLICATIONS

This application claims the benefit of priority to Provisional Application No. 63/400,912 filed on Aug. 25, 2022 and is a Continuation application of PCT Application No. PCT/JP2023/030459 filed on Aug. 24, 2023. The entire contents of each application are hereby incorporated herein by reference.

BACKGROUND OF THE INVENTION

1. Field of the Invention

The present invention relates to acoustic wave devices each including a plurality of acoustic wave resonators.

2. Description of the Related Art

Acoustic wave devices have heretofore been widely used in filters for mobile phones and the like. An acoustic wave device using bulk waves in a thickness-shear mode has recently been proposed, as described in U.S. Pat. No. 10,491,192. In this acoustic wave device, a piezoelectric layer is provided on a support. A pair of electrodes are provided on the piezoelectric layer. The pair of electrodes face each other on the piezoelectric layer and are connected to different potentials. An AC voltage is applied between the electrodes to excite bulk waves in the thickness-shear mode.

An acoustic wave device is, for example, an acoustic wave resonator, and is used in a ladder filter, for example. In order to obtain good characteristics in the ladder filter, the electrostatic capacitance ratio needs to be increased between a plurality of acoustic wave resonators. In this case, the electrostatic capacitances of some of the acoustic wave resonators in the ladder filter need to be increased.

In order to increase the electrostatic capacitance of the acoustic wave resonator, for example, the acoustic wave resonator needs to be increased in size. For this reason, in the case of using such an acoustic wave resonator in a ladder filter, the ladder filter tends to be increased in size. In particular, a ladder filter having an acoustic wave resonator that uses a thickness-shear mode bulk wave with a small electrostatic capacitance tends to be increased in size.

The inventors of example embodiments of the present invention have discovered that when an acoustic wave device is used in a filter device, providing the following configuration of the acoustic wave device can obtain a suitable filter waveform without increasing the size. In this configuration, an electrode connected to a potential different from an input potential and an output potential, such as a reference potential, is disposed between an electrode connected to the input potential and an electrode connected to the output potential.

The inventors of example embodiments of the present invention have also discovered that simply providing the above configuration may result in degradation of the filter characteristics.

SUMMARY OF THE INVENTION

Example embodiments of the present invention provide acoustic wave devices each able to achieve miniaturization of a filter device and reduce or prevent degradation of the filter characteristics.

An acoustic wave device according to an example embodiment of the present invention includes a first acoustic wave resonator including a first piezoelectric film including a first piezoelectric layer made of a piezoelectric body, and at least one second acoustic wave resonator electrically connected to the first acoustic wave resonator and including a second piezoelectric film including a second piezoelectric layer made of a piezoelectric body, and an IDT electrode on the second piezoelectric layer, the first acoustic wave resonator includes a first comb-shaped electrode on the first piezoelectric layer, including a first busbar and a plurality of first electrode fingers each including one end connected to the first busbar, and being connected to an input potential, a second comb-shaped electrode on the first piezoelectric layer, including a second busbar and a plurality of second electrode fingers each including one end connected to the second busbar and being interdigitated with the plurality of first electrode fingers, and being connected to an output potential, and a third electrode connected to a potential different from those connected to the first comb-shaped electrode and the second comb-shaped electrode, and including a plurality of third electrode fingers on the first piezoelectric layer so as to be aligned with the first electrode fingers and the second electrode fingers in a direction in which the first electrode fingers and the second electrode fingers are arranged in plan view, and a connection electrode connecting adjacent third electrode fingers, an order in which a first electrode finger, a second electrode finger, and a third electrode finger are arranged is such that, starting from the first electrode finger, the first electrode finger, the third electrode finger, the second electrode finger, and the third electrode finger define one period, the IDT electrode of the second acoustic wave resonator includes a plurality of fourth electrode fingers and a plurality of fifth electrode fingers interdigitated with each other, and the second acoustic wave resonator is a series arm resonator or a parallel arm resonator.

Example embodiments of the present invention provide acoustic wave devices each able to achieve miniaturization of a filter device and reduce or prevent degradation of the filter characteristics.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be clarified below by describing example embodiments of the present invention with reference to the drawings.

The example embodiments described in this specification are illustrative, and partial substitution or combination of configurations is possible between different example embodiments.

Figure 1:
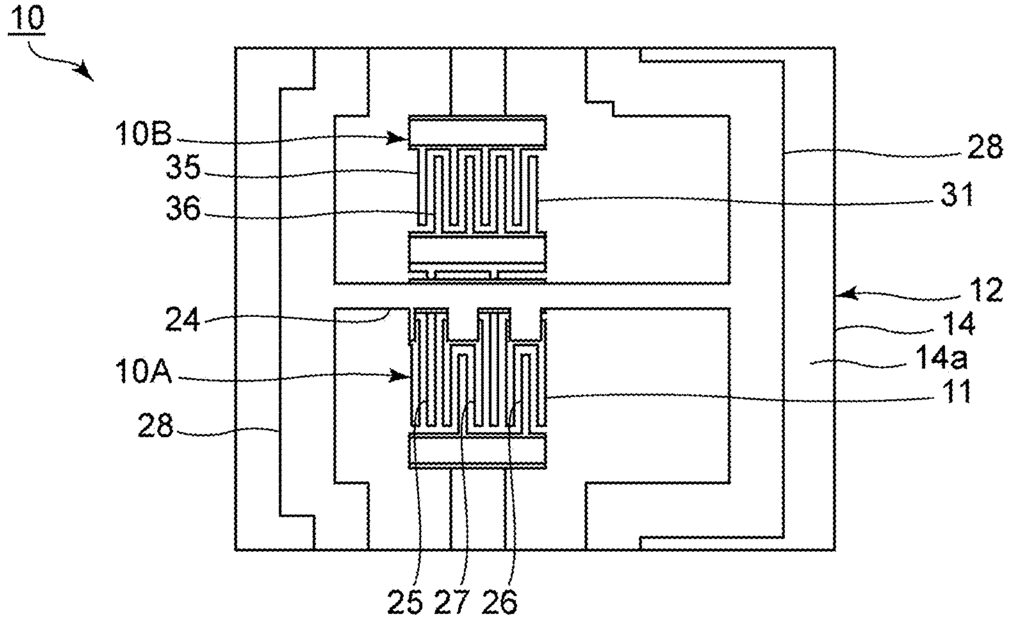
FIG. 1 is a schematic plan view of an acoustic wave device according to a first example embodiment of the present invention.

FIG. 1 is a schematic plan view of an acoustic wave device according to a first example embodiment of the present invention.

An acoustic wave device 10 is used as a portion of a filter device. The acoustic wave device 10 includes a plurality of acoustic wave resonators. However, the acoustic wave device 10 may also be, for example, a filter device. A configuration of the acoustic wave device 10 will be described below.

The acoustic wave device 10 includes one first acoustic wave resonator 10A and one second acoustic wave resonator 10B. The first acoustic wave resonator 10A is an acoustically coupled filter. The second acoustic wave resonator 10B is an acoustic wave resonator including an interdigital transducer (IDT) electrode 31. The number of the first acoustic wave resonator 10A and second acoustic wave resonator 10B in the acoustic wave device 10 is not limited to the above. The acoustic wave device may include at least one first acoustic wave resonator and at least one second acoustic wave resonator.

In the acoustic wave device 10, the first acoustic wave resonator 10A and the second acoustic wave resonator 10B are connected in series with each other. The second acoustic wave resonator 10B is a series arm resonator. In the present example embodiment, for example, the second acoustic wave resonator 10B is used as a trap element. The second acoustic wave resonator 10B may be, for example, a parallel arm resonator.

The acoustic wave device of the present example embodiment may have at least one of the following configurations. One configuration is a configuration in which at least one second acoustic wave resonator, which is a series arm resonator, is electrically connected to at least one first acoustic wave resonator. The other configuration is a configuration in which at least one second acoustic wave resonator, which is a parallel arm resonator, is electrically connected to at least one first acoustic wave resonator.

As illustrated in FIG. 1, the acoustic wave device 10 includes a piezoelectric substrate 12. The piezoelectric substrate 12 has piezoelectricity. The piezoelectric substrate 12 includes a piezoelectric layer 14 as a piezoelectric film. The first acoustic wave resonator 10A and the second acoustic wave resonator 10B share the piezoelectric substrate 12. Therefore, when the piezoelectric substrate of the first acoustic wave resonator 10A is a first piezoelectric substrate and the piezoelectric substrate of the second acoustic wave resonator 10B is a second piezoelectric substrate, the first piezoelectric substrate and the second piezoelectric substrate are defined by the same piezoelectric substrate 12 in the present example embodiment. Here, the piezoelectric layer is a layer made of a piezoelectric body. In this specification, on the other hand, the piezoelectric film is a film having piezoelectricity, and does not necessarily refer to a film made of a piezoelectric body. However, in the present example embodiment, the piezoelectric film is a single piezoelectric layer 14, which is a film made of a piezoelectric body. In the present invention, the piezoelectric film may be a multilayer film including the piezoelectric layer 14.

The first acoustic wave resonator 10A includes a first piezoelectric layer as a first piezoelectric film. The second acoustic wave resonator 10B includes a second piezoelectric layer as a second piezoelectric film. However, in the present example embodiment, the first acoustic wave resonator 10A and the second acoustic wave resonator 10B share the piezoelectric layer 14 as the piezoelectric film. Therefore, the first piezoelectric layer and the second piezoelectric layer are defined by the same piezoelectric layer 14. For example, the first acoustic wave resonator 10A and the second acoustic wave resonator 10B may individually include piezoelectric films. The first acoustic wave resonator 10A and the second acoustic wave resonator 10B may individually include piezoelectric substrates.

The configuration of the first acoustic wave resonator 10A, which is an acoustically coupled filter, will be specifically described below.

Figure 2:
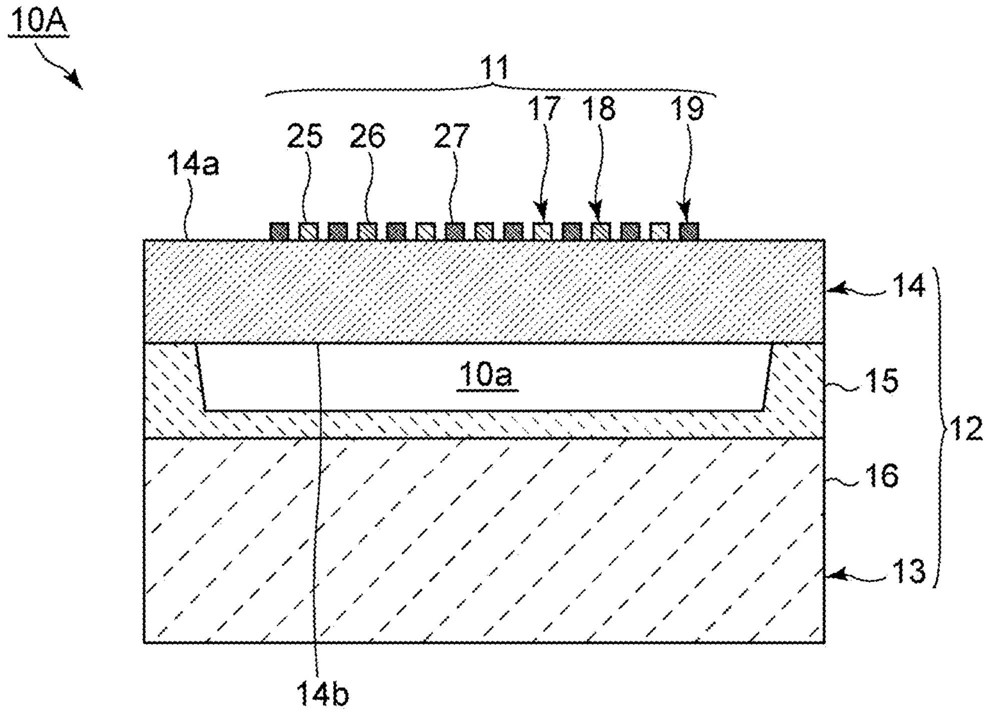
FIG. 2 is a schematic elevational cross-sectional view of a first acoustic wave resonator in the first example embodiment of the present invention.
Figure 3:
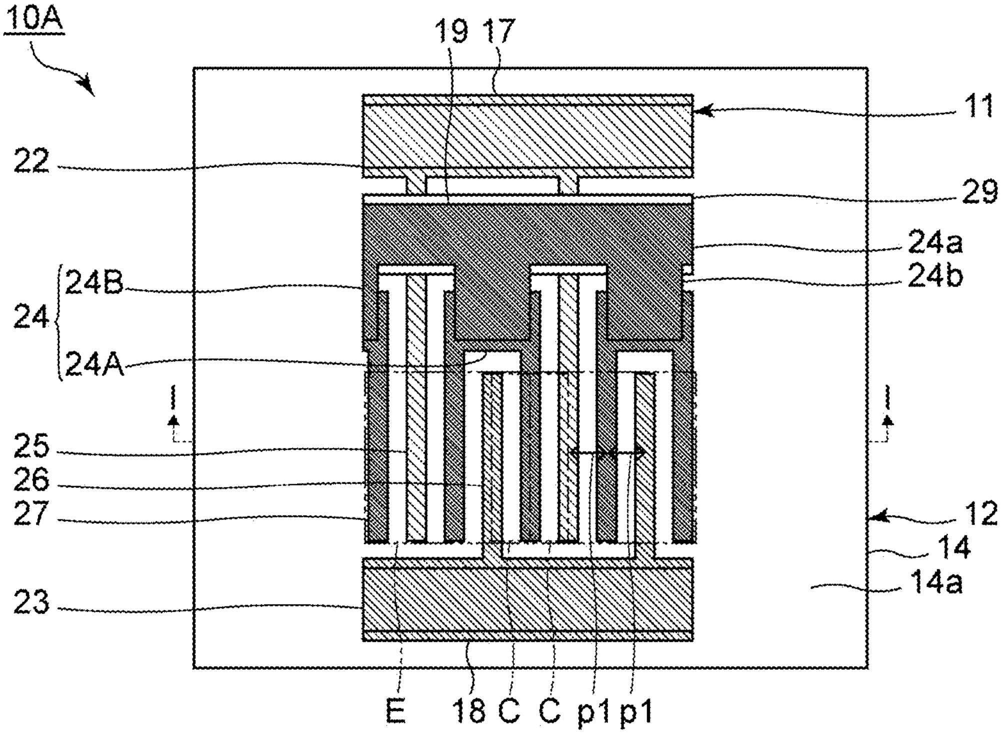
FIG. 3 is a schematic plan view of the first acoustic wave resonator in the first example embodiment of the present invention.

FIG. 2 is a schematic elevational cross-sectional view of the first acoustic wave resonator in the first example embodiment. FIG. 3 is a schematic plan view of the first acoustic wave resonator in the first example embodiment. FIG. 2 is a schematic cross-sectional view taken along line I-I in FIG. 3. Each electrode is hatched in FIG. 2. Similarly, electrodes may be hatched in schematic plan views other than FIG. 2. Wiring and the like connected to the first acoustic wave resonator are omitted in FIG. 3.

The first acoustic wave resonator 10A illustrated in FIG. 2 includes a piezoelectric substrate 12 as a first piezoelectric substrate and a functional electrode 11. The piezoelectric substrate 12 includes a support 13 and a piezoelectric layer 14 as a first piezoelectric layer. In the present example embodiment, the support 13 includes a support substrate 16 and an insulating layer 15. The insulating layer 15 is provided on the support substrate 16. The piezoelectric layer 14 is provided on the insulating layer 15. However, the support 13 may include only the support substrate 16. The support 13 does not necessarily have to be provided.

The piezoelectric layer 14 includes a first main surface 14*a* and a second main surface 14*b*. The first main surface 14*a* and the second main surface 14*b* face each other. Of the first main surface 14*a* and the second main surface 14*b*, the second main surface 14*b* is located on the support 13 side. In the present example embodiment, the piezoelectric layer 14 is made of, for example, lithium niobate. Specifically, the piezoelectric layer 14 is made of, for example, Z-cut $LiNbO_3$. However, the piezoelectric layer 14 may be made of, for example, rotated Y-cut lithium niobate. Alternatively, the piezoelectric layer 14 may be made of, for example, lithium tantalate such as $LiTaO_3$. In this specification, a certain member being made of a certain material includes a case where a trace amount of impurities is contained to the extent that the electrical characteristics of the acoustic wave device are not deteriorated.

The functional electrode 11 is provided on the first main surface 14*a* of the piezoelectric layer 14. As illustrated in FIG. 3, the functional electrode 11 includes a pair of comb-shaped electrodes and a third electrode 19. The pair of comb-shaped electrodes include a first comb-shaped electrode 17 and a second comb-shaped electrode 18. The first comb-shaped electrode 17 is connected to an input potential. The second comb-shaped electrode 18 is connected to an output potential. The third electrode 19 is connected to a reference potential in the present example embodiment. The third electrode 19 does not necessarily have to be connected to the reference potential. The third electrode 19 only needs to be connected to a potential different from those of the first comb-shaped electrode 17 and the second comb-shaped electrode 18. However, it is preferable that the third electrode 19 is connected to the reference potential.

The first comb-shaped electrode 17 and the second comb-shaped electrode 18 are provided on the first main surface 14*a* of the piezoelectric layer 14. The first comb-shaped electrode 17 includes a first busbar 22 and a plurality of first electrode fingers 25. The plurality of first electrode fingers 25 each include one end connected to the first busbar 22. The second comb-shaped electrode 18 includes a second busbar 23 and a plurality of second electrode fingers 26. The plurality of second electrode fingers 26 each include one end connected to the second busbar 23.

The first busbar 22 and the second busbar 23 face each other. The plurality of first electrode fingers 25 and the plurality of second electrode fingers 26 are interdigitated with each other. The first electrode fingers 25 and the second electrode fingers 26 are alternately arranged in a direction orthogonal or substantially orthogonal to a direction in which the first electrode fingers 25 and the second electrode fingers 26 extend.

The third electrode 19 includes a third busbar 24 as a connection electrode and a plurality of third electrode fingers 27. The plurality of third electrode fingers 27 are provided on the first main surface 14*a* of the piezoelectric layer 14. The plurality of third electrode fingers 27 are electrically connected to each other by the third busbar 24.

The plurality of third electrode fingers 27 are provided so as to be aligned with the first electrode fingers 25 and the second electrode fingers 26 in a direction in which the first electrode fingers 25 and the second electrode fingers 26 are arranged. Therefore, the first electrode fingers 25, the second electrode fingers 26, and the third electrode fingers 27 are arranged in one direction. The plurality of third electrode fingers 27 extend parallel or substantially parallel to the plurality of first electrode fingers 25 and the plurality of second electrode fingers.

Hereinafter, the direction in which the first electrode fingers 25, the second electrode fingers 26, and the third electrode fingers 27 extend will be referred to as an electrode finger extending direction, and the direction orthogonal or substantially orthogonal to the electrode finger extending direction will be referred to as an electrode finger orthogonal direction. When the direction in which the first electrode fingers 25, the second electrode fingers 26, and the third electrode fingers 27 are arranged is referred to as an electrode finger arrangement direction, the electrode finger arrangement direction is parallel to the electrode finger orthogonal direction. In this specification, the first electrode fingers 25, the second electrode fingers 26, and the third electrode fingers 27 may be collectively referred to simply as electrode fingers. The first busbar 22 and the second busbar 23 may be collectively referred to simply as busbars.

Figure 4:
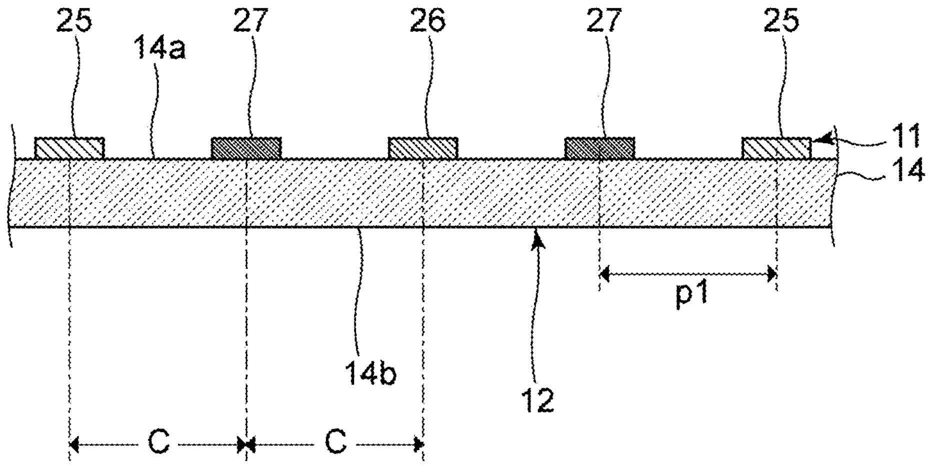
FIG. 4 is a schematic elevational cross-sectional view illustrating the vicinity of first to third electrode fingers in the first example embodiment of the present invention.

FIG. 4 is a schematic elevational cross-sectional view illustrating the vicinity of the first to third electrode fingers in the first example embodiment.

The plurality of electrode fingers are arranged as follows. Specifically, starting from the first electrode finger 25, one period includes the first electrode finger 25, the third electrode finger 27, the second electrode finger 26, and the third electrode finger 27. Therefore, the order in which the plurality of electrode fingers are arranged is the first electrode finger 25, the third electrode finger 27, the second electrode finger 26, the third electrode finger 27, the first electrode finger 25, the third electrode finger 27, the second electrode finger 26, . . . and so on. The order of the plurality of electrode fingers is represented as the order of the potentials to be connected, IN, GND, OUT, GND, IN, GND, OUT, . . . and so on, where IN represents the input potential, OUT represents the output potential, and GND represents the reference potential.

In the present example embodiment, in a region where the plurality of electrode fingers are provided, the electrode fingers located at both end portions in the electrode finger orthogonal direction are both third electrode fingers 27. In this region, the electrode fingers located at the end portions in the electrode finger orthogonal direction may be any kind of the first electrode fingers 25, the second electrode fingers 26, and the third electrode fingers 27.

As illustrated in FIG. 3, the third busbar 24 as the connection electrode for the third electrode 19 electrically connects the plurality of third electrode fingers 27 to each other. Specifically, the third busbar 24 is located in a region between the first busbar 22 and leading ends of the plurality of second electrode fingers 26. The plurality of first electrode fingers 25 are also located in this region. The third busbar 24 and the plurality of first electrode fingers 25 are electrically insulated from each other by the insulating film 29.

More specifically, the third busbar 24 includes a plurality of first connection electrodes 24A and one second connection electrode 24B. Each of the first connection electrodes 24A connects leading ends of two adjacent third electrode fingers 27. The first connection electrode 24A and the two third electrode fingers 27 form a U-shaped electrode. The second connection electrode 24B connects the plurality of first connection electrodes 24A to each other. The insulating film 29 is provided between this second connection electrode 24B and the plurality of first electrode fingers 25.

To be more specific, the insulating film 29 is provided on the first main surface 14*a* of the piezoelectric layer 14 so as to partially cover the plurality of first electrode fingers 25. The insulating film 29 is provided in the region between the first busbar 22 and the leading ends of the plurality of second electrode fingers 26. The insulating film 29 has a strip shape.

The insulating film 29 does not extend to the first connection electrode 24A of the third electrode 19. The second connection electrode 24B is provided on the insulating film 29 and over the plurality of first connection electrodes 24A.

Specifically, the second connection electrode 24B includes a bar portion 24*a* and a plurality of protrusions 24*b*. Each protrusion 24*b* extends from the bar portion 24*a* toward a corresponding one of the first connection electrodes 24A. Each protrusion 24*b* is connected to a corresponding one of the first connection electrodes 24A. The third electrode fingers 27 are thus electrically connected to each other by the first connection electrode 24A and the second connection electrode 24B.

In the present example embodiment, the third busbar 24 is located in the region between the first busbar 22 and the leading ends of the plurality of second electrode fingers 26. Therefore, the leading ends of the plurality of second electrode fingers 26 face the third busbar 24 with a gap therebetween in the electrode finger extending direction. On the other hand, the leading ends of the plurality of first electrode fingers 25 face the second busbar 23 with a gap therebetween in the electrode finger extending direction.

The third busbar 24 may be located in a region between the second busbar 23 and the leading ends of the plurality of first electrode fingers 25. In this case, the leading ends of the plurality of first electrode fingers 25 each face the third busbar 24 with a gap therebetween. On the other hand, the leading ends of the plurality of second electrode fingers 26 face the first busbar 22 with a gap therebetween.

The first acoustic wave resonator 10A is, for example, an acoustic wave resonator configured to be able to use a thickness-shear mode bulk wave. As illustrated in FIG. 3, the first acoustic wave resonator 10A includes a plurality of excitation regions C. In the plurality of excitation regions C, the thickness-shear mode bulk waves and acoustic waves in other modes are excited. FIG. 3 illustrates only two of the plurality of excitation regions C.

Some of the plurality of excitation regions C are regions where the adjacent first electrode finger 25 and third electrode finger 27 overlap when viewed from the electrode finger orthogonal direction, and also regions between the centers of the adjacent first electrode finger 25 and third electrode finger 27. The rest of the excitation regions C are regions where the adjacent second electrode finger 26 and third electrode finger 27 overlap when viewed from the electrode finger orthogonal direction, and also regions between the centers of the adjacent second electrode finger 26 and third electrode finger 27. These excitation regions C are arranged in the electrode finger orthogonal direction.

The configuration of the functional electrode 11, except for the third electrode 19, is the same or substantially the same as that of the IDT electrode. When viewed from the electrode finger orthogonal direction, the region where the adjacent first electrode finger 25 and second electrode finger 26 overlap each other is an intersection region E. The intersection region E can also be said to be a region where the adjacent first electrode finger 25 and third electrode finger 27 or the adjacent second electrode finger 26 and third electrode finger 27 overlap each other when viewed from the electrode finger orthogonal direction. The intersection region E includes a plurality of excitation regions C. The intersection region E and the excitation region C are regions of the piezoelectric layer 14 defined based on the configuration of the functional electrode 11.

Figure 5:
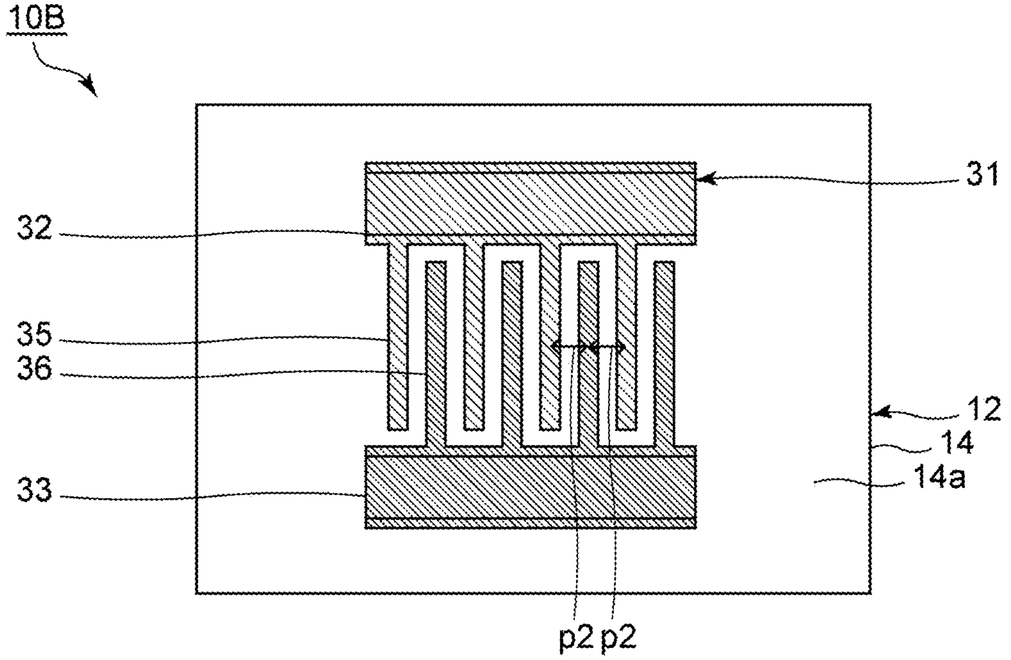
FIG. 5 is a schematic plan view of a second acoustic wave resonator in the first example embodiment of the present invention.

FIG. 5 is a schematic plan view of the second acoustic wave resonator in the first example embodiment. Wiring connected to the second acoustic wave resonator is omitted in FIG. 5.

The second acoustic wave resonator 10B is, for example, configured to be able to use a thickness-shear mode bulk wave. The second acoustic wave resonator 10B includes the piezoelectric substrate 12 as the second piezoelectric substrate, and the IDT electrode 31. The piezoelectric substrate 12 includes the support 13 illustrated in FIG. 2 and the piezoelectric layer 14 as the second piezoelectric layer.

As illustrated in FIG. 5, the IDT electrode 31 includes a pair of busbars and a plurality of electrode fingers. The pair of busbars include a fourth busbar 32 and a fifth busbar 33. The fourth busbar 32 and the fifth busbar 33 face each other. The plurality of electrode fingers include a plurality of fourth electrode fingers 35 and a plurality of fifth electrode fingers 36. The plurality of fourth electrode fingers 35 each include one end connected to the fourth busbar 32. The plurality of fifth electrode fingers 36 each include one end connected to the fifth busbar 33. The plurality of fourth electrode fingers 35 and the plurality of fifth electrode fingers 36 are interdigitated with each other.

Hereinafter, the fourth electrode fingers 35 and the fifth electrode fingers 36 may be collectively referred to simply as electrode fingers. The fourth busbar 32 and the fifth busbar 33 may be collectively referred to simply as busbars. In the second acoustic wave resonator 10B, the direction in which the fourth electrode finger 35 and the fifth electrode finger 36 extend is the electrode finger extending direction, and the direction orthogonal or substantially orthogonal to the electrode finger extending direction is the electrode finger orthogonal direction.

As with the first acoustic wave resonator 10A, the second acoustic wave resonator 10B also includes an excitation region and an intersection region. In the second acoustic wave resonator 10B, the excitation region is a region where the adjacent fourth electrode finger 35 and fifth electrode finger 36 overlap each other when viewed from the electrode finger orthogonal direction, and is a region between the centers of the adjacent fourth electrode finger 35 and fifth electrode finger 36. In the second acoustic wave resonator 10B, the intersection region is a region where the adjacent fourth electrode finger 35 and fifth electrode finger 36 overlap each other when viewed from the electrode finger orthogonal direction. In the second acoustic wave resonator 10B, the intersection region also includes a plurality of excitation regions.

Referring back to FIG. 3, in the first acoustic wave resonator 10A, p1 is the center-to-center distance between the adjacent first electrode finger 25 and third electrode finger 27 and between the adjacent second electrode finger 26 and third electrode finger 27. The center-to-center distance p1 between the adjacent pairs of the first electrode fingers 25 and the third electrode fingers 27 is the same or substantially same as the center-to-center distance p1 between the adjacent pairs of the second electrode fingers 26 and the third electrode fingers 27. However, the center-to-center distance p1 does not have to be constant.

In the second acoustic wave resonator 10B illustrated in FIG. 5, p2 is the center-to-center distance between the adjacent fourth electrode finger 35 and fifth electrode finger 36. The center-to-center distance p2 between the adjacent pairs of the fourth electrode fingers 35 and the fifth electrode fingers 36 is the same or substantially the same for all pairs. However, the center-to-center distance p2 does not have to be constant.

The relationship between the center-to-center distance p1 in the first acoustic wave resonator 10A and the center-to-center distance p2 in the second acoustic wave resonator 10B as a series arm resonator, is $p2 \neq p1$. Specifically, for example, $p2 < p1$. The relationship between the center-to-center distance p1 and the center-to-center distance p2 is not limited to the above.

In the present example embodiment, for example, Al is used as the material for the first electrode fingers 25, the second electrode fingers 26, and the third electrode fingers 27 in the first acoustic wave resonator 10A as well as for the fourth electrode fingers 35 and the fifth electrode fingers 36 in the second acoustic wave resonator 10B. However, the material for the respective electrode fingers of the first acoustic wave resonator 10A and the respective electrode fingers of the second acoustic wave resonator 10B is not limited to the above. Alternatively, for example, the respective electrode fingers of the first acoustic wave resonator 10A and the respective electrode fingers of the second acoustic wave resonator 10B may include multilayer metal films.

The width of each electrode finger of the first acoustic wave resonator 10A and the width of each electrode finger of the second acoustic wave resonator 10B are the same or substantially the same. However, the width of each electrode finger of the first acoustic wave resonator 10A and the width of each electrode finger of the second acoustic wave resonator 10B may be different from each other. The width of the electrode finger is the dimension of the electrode finger along the electrode finger orthogonal direction.

The thickness of each electrode finger of the first acoustic wave resonator 10A and the thickness of each electrode finger of the second acoustic wave resonator 10B are the same or substantially the same. However, the thickness of each electrode finger of the first acoustic wave resonator 10A and the thickness of each electrode finger of the second acoustic wave resonator 10B may be different from each other.

In the present example embodiment, the first acoustic wave resonator 10A as an acoustically coupled filter is connected to the second acoustic wave resonator 10B including the IDT electrode 31, and the second acoustic wave resonator 10B is the series arm resonator. This makes it possible to achieve miniaturization of a filter device and to reduce or prevent degradation of the filter characteristics when the acoustic wave device 10 is used in the filter device. This will be described below by comparing the present example embodiment with a first comparative example.

The first comparative example differs from the first example embodiment in not including the second acoustic wave resonator. The bandpass characteristics of the first example embodiment and the first comparative example are derived through simulation. The design parameters of the acoustic wave device 10 having the configuration of the first example embodiment are as follows.

Piezoelectric layer

Material: Z-cut $LiNbO_3$

Thickness: about 400 nm

First electrode finger, second electrode finger, and third electrode finger

Material: Al

Thickness: about 400 nm

Width: about 420 nm

Fourth electrode finger and fifth electrode finger

Material: Al

Thickness: about 400 nm

Width: about 420 nm

Center-to-center distance p1 in first acoustic wave resonator: about 1.4 μm

Center-to-center distance p2 in second acoustic wave resonator: about 1 μm

Figure 6:
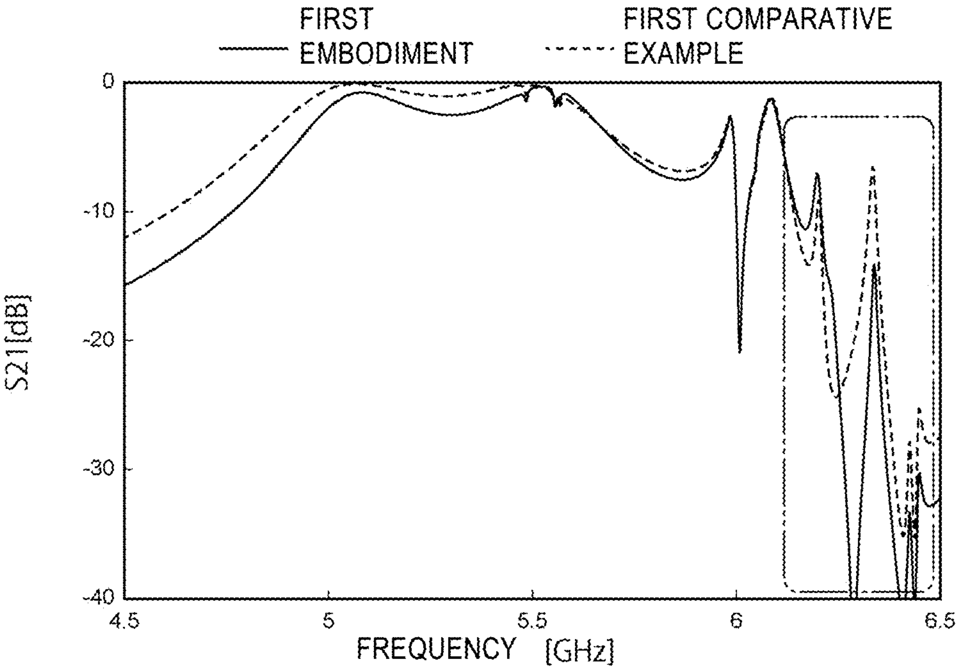
FIG. 6 is a graph illustrating bandpass characteristics of the first example embodiment of the present invention and a first comparative example.

FIG. 6 is a graph illustrating the bandpass characteristics of the first example embodiment and the first comparative example. FIG. 6 illustrates S21 bandpass characteristics.

First, as can be seen from FIG. 6, the filter characteristics are obtained in the acoustic wave device 10 of the first example embodiment. The first acoustic wave resonator 10A in the acoustic wave device 10 is an acoustically coupled filter. More specifically, as illustrated in FIG. 3, the first acoustic wave resonator 10A includes an excitation region C located between the centers of the adjacent first electrode finger 25 and third electrode finger 27 and an excitation region C located between the centers of the adjacent second electrode finger 26 and third electrode finger 27. In these excitation regions C, acoustic waves in a plurality of modes including a thickness-shear mode bulk wave are excited. By coupling these modes, a filter waveform can be suitably obtained.

Therefore, when the acoustic wave device 10 is used in a filter device, a filter waveform can be suitably obtained even when the filter device includes a small number of acoustic wave resonators. This makes it possible to achieve the miniaturization of the filter device.

Furthermore, in FIG. 6, a frequency range on a higher frequency side than the pass band in the first example embodiment and the first comparative example is surrounded and indicated by a two-dot chain line. As illustrated in FIG. 6, in the first example embodiment, the attenuation on the higher frequency side than the pass band is larger than that in the first comparative example. In the first example embodiment, attenuation characteristic as the filter characteristic can thus be improved.

When the second acoustic wave resonator 10B is a series arm resonator as in the first example embodiment illustrated in FIG. 1, for example, it is preferable that $p2 < p1$. This makes it possible to more reliably provide a trap characteristic on the higher frequency side than the pass band even when the second acoustic wave resonator 10B includes no frequency adjustment film. This makes it possible to more reliably improve the attenuation characteristics.

The configuration of the first example embodiment will be described in more detail below.

As illustrated in FIG. 1, a connection wiring 28 is provided on the first main surface 14*a* of the piezoelectric layer 14. The connection wiring 28 is connected to the reference potential. The third busbar 24, as the connection electrode, of the first acoustic wave resonator 10A is connected to the connection wiring 28. The third busbar 24 is connected to the reference potential through the connection wiring 28.

In the first example embodiment, the first busbar 22 of the first acoustic wave resonator 10A and the fifth busbar 33 of the second acoustic wave resonator 10B are integrally provided as the busbar. The busbar is shared by the first acoustic wave resonator 10A and the second acoustic wave resonator 10B. However, the first busbar 22 and the fifth busbar 33 may be individually provided.

As illustrated in FIG. 2, the support 13 includes the support substrate 16 and the insulating layer 15. The piezoelectric substrate 12 is a multilayer body of the support substrate 16, the insulating layer 15, and the piezoelectric layer 14. Specifically, the piezoelectric layer 14 and the support 13 overlap when viewed from the direction in which the first main surface 14*a* and the second main surface 14*b* of the piezoelectric layer 14 face each other.

Examples of the material of the support substrate 16 include a semiconductor such as silicon, ceramics such as aluminum oxide, and the like. The insulating layer 15 can be made of an appropriate dielectric such as, for example, silicon oxide or tantalum oxide.

The insulating layer 15 includes a recess portion. The piezoelectric layer 14 as the piezoelectric film is provided on the insulating layer 15 so as to close the recess portion. A hollow portion is thus provided. This hollow portion is a cavity 10*a*. In the first example embodiment, the support 13 and the piezoelectric film are disposed so that a portion of the support 13 and a portion of the piezoelectric film face each other across the cavity 10*a*. However, the recess portion in the support 13 may be provided across the insulating layer 15 and the support substrate 16. Alternatively, a recess portion provided only in the support substrate 16 may be closed by the insulating layer 15. The recess portion may be, for example, provided in the piezoelectric layer 14. The cavity 10*a* may be, for example, a through-hole provided in the support 13.

The cavity 10*a* is an acoustic reflection portion in the present example embodiment. The acoustic reflection portion can effectively confine the energy of the acoustic wave to the piezoelectric layer 14 side. The acoustic reflection portion may be provided at a position on the support 13 that overlaps at least a part of the functional electrode 11 in plan view. More specifically, the first electrode finger 25, the second electrode finger 26, and the third electrode finger 27 may each at least partially overlap with the acoustic reflection portion in plan view. In plan view, a plurality of excitation regions C preferably overlap with the acoustic reflection portion.

In this specification, a plan view refers to a view along the lamination direction of the support 13 and the piezoelectric film from a direction corresponding to the upper side in FIG. 2. In FIG. 2, for example, of the support substrate 16 side and the piezoelectric layer 14 side, the piezoelectric layer 14 side is the upper side. Furthermore, in this specification, the plan view is synonymous with a view from a main surface facing direction. The main surface facing direction is a direction in which the first main surface 14*a* and the second main surface 14*b* of the piezoelectric layer 14 face each other. More specifically, the main surface facing direction is, for example, a normal or substantially normal direction of the first main surface 14*a*.

Although not illustrated, an acoustic reflection portion is also provided in the second acoustic wave resonator 10B illustrated in FIG. 5. The acoustic reflection portion of the second acoustic wave resonator 10B may be provided at a position on the support 13 that overlaps with at least a portion of the IDT electrode 31 in plan view. More specifically, the fourth electrode finger 35 and the fifth electrode finger 36 may each at least partially overlap with the acoustic reflection portion in plan view. It is preferable that the plurality of excitation regions in the second acoustic wave resonator 10B overlap with the acoustic reflection portion in plan view.

The acoustic reflection portion may be an acoustic reflection film such as, for example, an acoustic multilayer film, which will be described later. For example, the acoustic reflection film may be provided on the surface of the support.

In the first example embodiment, the center-to-center distance p1 is constant in the first acoustic wave resonator 10A. However, the center-to-center distance p1 between the adjacent first electrode finger 25 and third electrode finger 27 and the center-to-center distance p1 between the adjacent second electrode finger 26 and third electrode finger 27 does not have to be constant. In this case, p is the longest distance among the center-to-center distance p1 between the adjacent first electrode finger 25 and third electrode finger 27 and the center-to-center distance p1 between the adjacent second electrode finger 26 and third electrode finger 27. When the center-to-center distance p1 is constant as in the first example embodiment, the center-to-center distance p1 between any adjacent electrode fingers is also the distance p.

The first piezoelectric layer of the first acoustic wave resonator 10A is a first piezoelectric film of the present invention. d/p is, for example, preferably less than or equal to about 0.5, and more preferably less than or equal to about 0.24, where d is the thickness of the first piezoelectric film. This allows for better excitation of the thickness-shear mode bulk wave in the first acoustic wave resonator 10A. In the first example embodiment, the thickness d is the thickness of the piezoelectric layer 14 as the first piezoelectric layer.

In the second acoustic wave resonator 10B, d/p is, for example, preferably less than or equal to about 0.5, and more preferably less than or equal to about 0.24, where p is the longest distance among the center-to-center distances p2 between the adjacent fourth electrode fingers 35 and fifth electrode fingers 36 and d is the thickness of the piezoelectric layer 14 as the second piezoelectric layer. This allows for better excitation of the thickness-shear mode bulk wave in the second acoustic wave resonator 10B. When the center-to-center distance p2 is constant as in the first example embodiment, the center-to-center distance p2 between any adjacent electrode fingers is also the distance p.

The first acoustic wave resonator does not necessarily have to be configured to be able to use the thickness-shear mode bulk wave. For example, the first acoustic wave resonator of an example embodiment of the present invention may be configured to be able to excite a plate wave. In this case, the excitation region is the intersection region E illustrated in FIG. 3. Similarly, the second acoustic wave resonator may be configured to be able to excite a plate wave.

As described above, in the first example embodiment, the piezoelectric layer 14 is made of, for example, Z-cut $LiNbO_3$. However, the piezoelectric layer 14 may also be made of, for example, rotated Y-cut lithium niobate. In this case, the fractional band width of the first acoustic wave resonator 10A depends on the Euler angles (φ, θ, ψ) of the lithium niobate used in the piezoelectric layer 14. The fractional band width is expressed by $(|fa-fr|/fr)\times 100$ [%], where fr is the resonant frequency and fa is the anti-resonant frequency.

The relationship between the fractional band width of the first acoustic wave resonator 10A and the Euler angles (φ, θ, ψ) of the piezoelectric layer 14 when d/p is infinitely close to θ is derived. φ in the Euler angles is set to about 0°.

Figure 7:
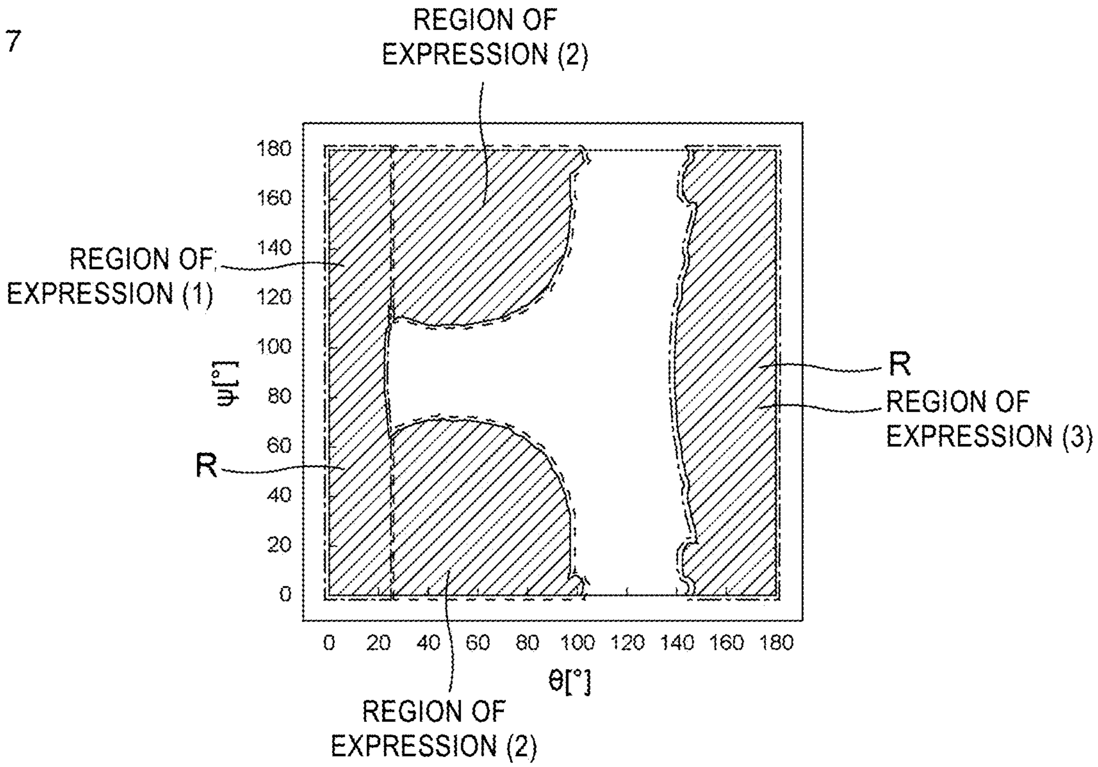
FIG. 7 is a diagram illustrating a map of a fractional band width with respect to Euler angles (0°, θ, ψ) of $LiNbO_3$ when d/p is infinitely close to 0.

FIG. 7 is a diagram illustrating a map of a fractional band width with respect to the Euler angles (0°, θ, ψ) of $LiNbO_3$ when d/p is infinitely close to 0.

A hatched region R in FIG. 7 is a region where the fractional band width of at least more than or equal to about 2% is obtained. The range of the region R is approximated by the following Expressions (1), (2), and (3). When φ in the Euler angles (φ, θ, ψ) are within the range of about 0°±10°, the relationship between θ and ψ and the fractional band width is the same as that illustrated in FIG. 7. Also in the case where the piezoelectric layer 14 is, for example, a lithium tantalate layer, when φ is within the range of about 0°±10°, the relationship between θ and ψ and the fractional band width is the same as that illustrated in FIG. 7.

$$(\text{within the range of } 0°\pm10°,\ 0° \text{ to } 25°,\ \text{any } \psi) \quad \text{Expression (1)}$$

$$(\text{within the range of } 0°\pm10°, 25° \text{ to } 100°, 0° \text{ to } 75°[(1-(\theta-50)^2/2500)]^{1/2} \text{ or } 180°-75°[(1-(\theta-50)^2/2500)]^{1/2} \text{ to } 180°) \quad \text{Expression (2)}$$

$$(\text{within the range of } 0°\pm10°, 180°-40°[(1-(\psi-90)^2/8100)]^{1/2} \text{ to } 180°,\ \text{any } \psi) \quad \text{Expression (3)}$$

It is preferable that the Euler angles are within the range of Expression (1), Expression (2), or Expression (3). This allows the fractional band width to be sufficiently widened, thus making it possible to suitably use the acoustic wave device 10 including the first acoustic wave resonator 10A in a filter device.

Figure 8:
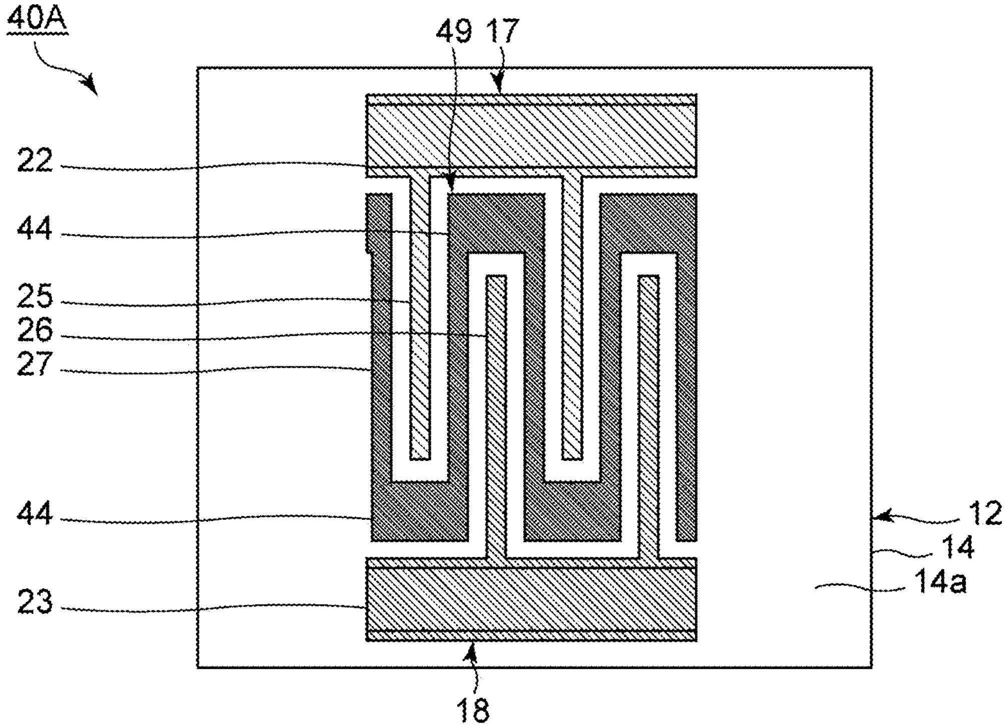
FIG. 8 is a schematic plan view of a first acoustic wave resonator in a first modification of the first example embodiment of the present invention.

As illustrated in FIG. 3, in the first example embodiment, the third electrode 19 includes the third busbar 24 as a connection electrode and the plurality of third electrode fingers 27. The third electrode 19 is, for example, a comb-shaped electrode. However, the third electrode 19 does not have to be a comb-shaped electrode. For example, in a first modification of the first example embodiment illustrated in FIG. 8, the third electrode 49 has a meandering shape. In the present modification, the insulating film 29 is not provided on the piezoelectric layer 14. The connection electrode 44 includes only a portion corresponding to the plurality of first connection electrodes 24A in the first example embodiment. The connection electrode 44 in the present modification is not a third busbar.

More specifically, the third electrode 39 includes a plurality of connection electrodes 44 located on the first busbar 22 side and a plurality of connection electrodes 44 located on the second busbar 23 side. The leading ends of two adjacent third electrode fingers 27 on the first busbar 22 side or the leading ends of two adjacent third electrode fingers 27 on the second busbar 23 side are connected to each other by the connection electrode 44. For example, among the plurality of third electrode fingers 27, the third electrode fingers 27 other than those at both ends in the electrode finger orthogonal direction include respective connection electrodes 44 connected to the leading ends on the first busbar 22 side and the leading ends on the second busbar 23 side. Each third electrode finger 27 is connected to its neighboring third electrode fingers 27 by the connection electrodes 44. By repeating this structure, the third electrode 39 is provided with a meandering shape.

In the present modification, a first acoustic wave resonator 40A, which is an acoustically coupled filter, is connected to a second acoustic wave resonator 10B, which is the same or substantially the same as in the first example embodiment. The second acoustic wave resonator 10B is a series arm resonator. This makes it possible to achieve miniaturization of a filter device and to reduce or prevent degradation of the filter characteristics when the acoustic wave device is used in the filter device.

The second acoustic wave resonator 10B may include a frequency adjustment film. For example, in a second modification of the first example embodiment illustrated in FIG. 9, a frequency adjustment film 48 is provided on the first main surface 14*a* of the piezoelectric layer 14 as the second piezoelectric layer so as to cover the IDT electrode 31. The frequency adjustment film 48 can be made of, for example, silicon oxide, silicon nitride or the like.

A second acoustic wave resonator 40B is a series arm resonator. In the present modification, the second acoustic wave resonator 40B is connected to a first acoustic wave resonator 10A as an acoustically coupled filter, which is the same or substantially the same as in the first example embodiment.

By adjusting the thickness of the frequency adjustment film 48, the trap characteristics of the second acoustic wave resonator 40B can be more reliably provided on the higher frequency side than the pass band of the acoustic wave device. This makes it possible to more reliably improve the attenuation characteristics. Therefore, in the present modification, it is possible to achieve miniaturization of a filter device and to more reliably improve the attenuation characteristics as the filter characteristics when the acoustic wave device is used in the filter device.

Figure 10:
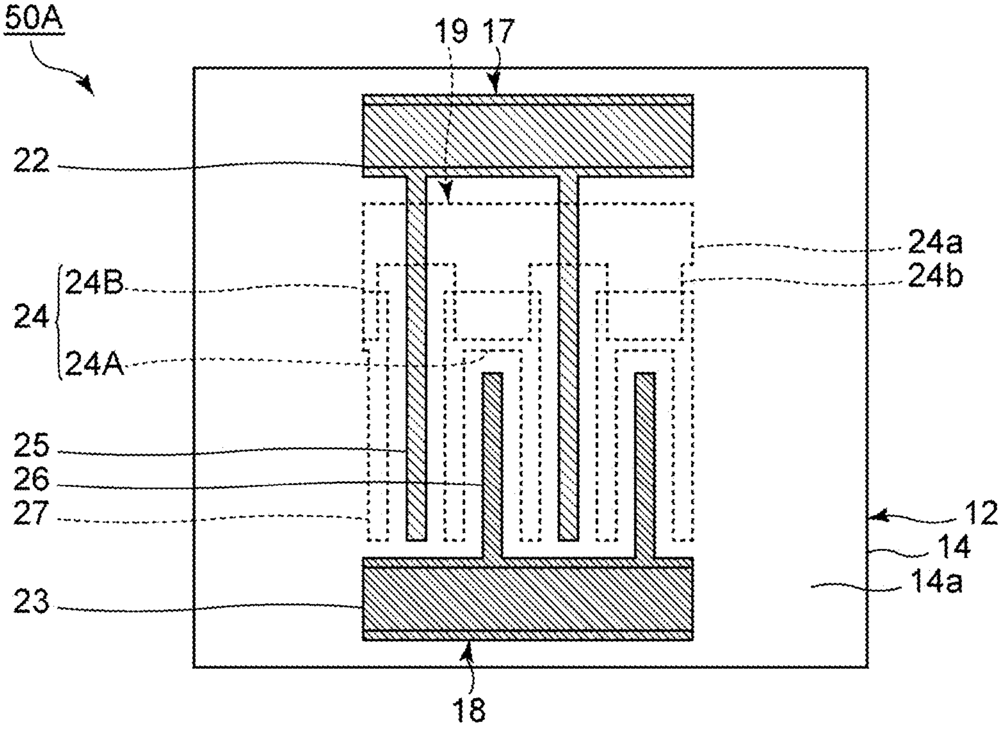
FIG. 10 is a schematic plan view of a first acoustic wave resonator in a second example embodiment of the present invention.
Figure 11:
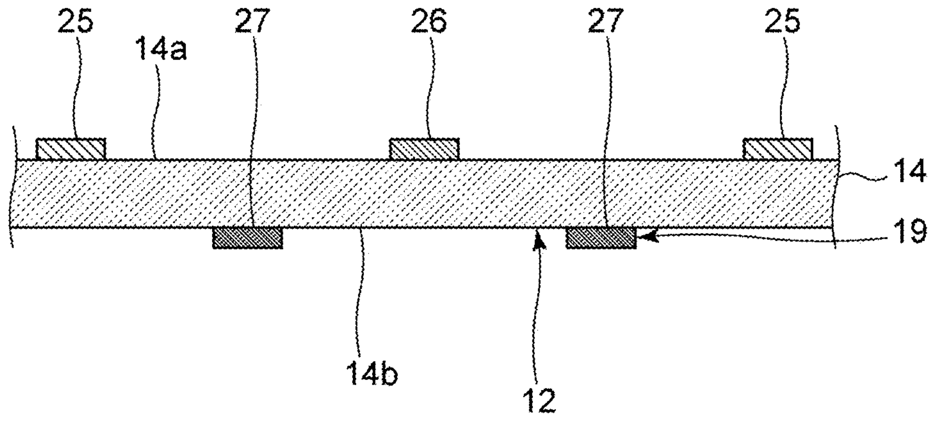
FIG. 11 is a schematic elevational cross-sectional view illustrating the vicinity of first to third electrode fingers in the second example embodiment of the present invention.

FIG. 10 is a schematic plan view of a first acoustic wave resonator in a second example embodiment of the present invention. FIG. 11 is a schematic elevational cross-sectional view illustrating the vicinity of first to third electrode fingers in the second example embodiment.

As illustrated in FIGS. 10 and 11, the present example embodiment differs from the first example embodiment in that a third electrode 19 is provided on a second main surface 14*b* of a piezoelectric layer 14. Otherwise, the acoustic wave device of the present example embodiment has the same or substantially the same configuration as that of the acoustic wave device 10 of the first example embodiment. A first acoustic wave resonator 50A is connected to a second acoustic wave resonator 10B as a series arm resonator, which is the same or substantially the same as in the first example embodiment.

The arrangement of the third electrode 19 in the present example embodiment in plan view is the same or substantially the same as that in the first example embodiment. Therefore, in plan view, a plurality of third electrode fingers 27 are provided on the second main surface 14*b* of the piezoelectric layer 14 so as to be aligned with first electrode fingers 25 and second electrode fingers 26 in a direction in which the first electrode fingers 25 and the second electrode fingers 26 are arranged. In plan view, the order in which the plurality of electrode fingers are arranged is such that, starting from the first electrode finger 25, the first electrode finger 25, the third electrode finger 27, the second electrode finger 26, and the third electrode finger 27 form one period.

It is possible also in the present example embodiment, as in the first example embodiment, to achieve miniaturization of a filter device and to reduce or prevent degradation of the filter characteristics when the acoustic wave device is used in the filter device.

Figure 12:
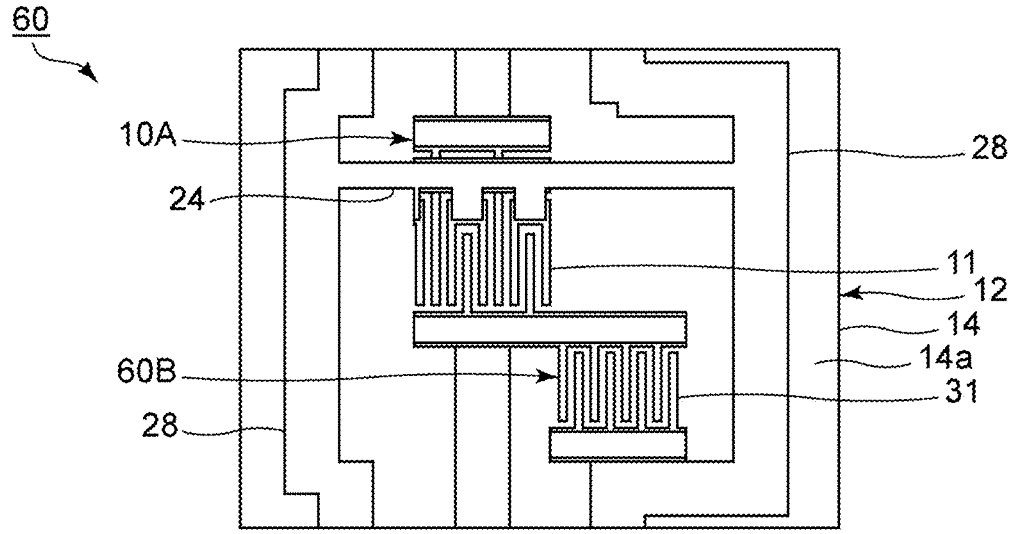
FIG. 12 is a schematic plan view of an acoustic wave device according to a third example embodiment of the present invention.

FIG. 12 is a schematic plan view of an acoustic wave device according to a third example embodiment of the present invention.

The present example embodiment differs from the first example embodiment in that a second acoustic wave resonator 60B is a parallel arm resonator. The present example embodiment also differs from the first example embodiment in that the relationship between the center-to-center distance p1 in the first acoustic wave resonator 10A and the center-to-center distance p2 in the second acoustic wave resonator 60B is p2>2p1. Otherwise, an acoustic wave device 60 of the present example embodiment has the same or substantially the same configuration as that of the acoustic wave device 10 of the first example embodiment.

It is possible also in the present example embodiment to achieve miniaturization of a filter device and to reduce or prevent degradation of the filter characteristics when the acoustic wave device 60 is used in the filter device. This will be described below by comparing the present example embodiment with a second comparative example.

The second comparative example differs from the third example embodiment in including no second acoustic wave resonator provided. The bandpass characteristics of the third example embodiment and the second comparative example are derived through simulation. The design parameters of the acoustic wave device 60 having the configuration of the third example embodiment are as follows.

Figure 13:
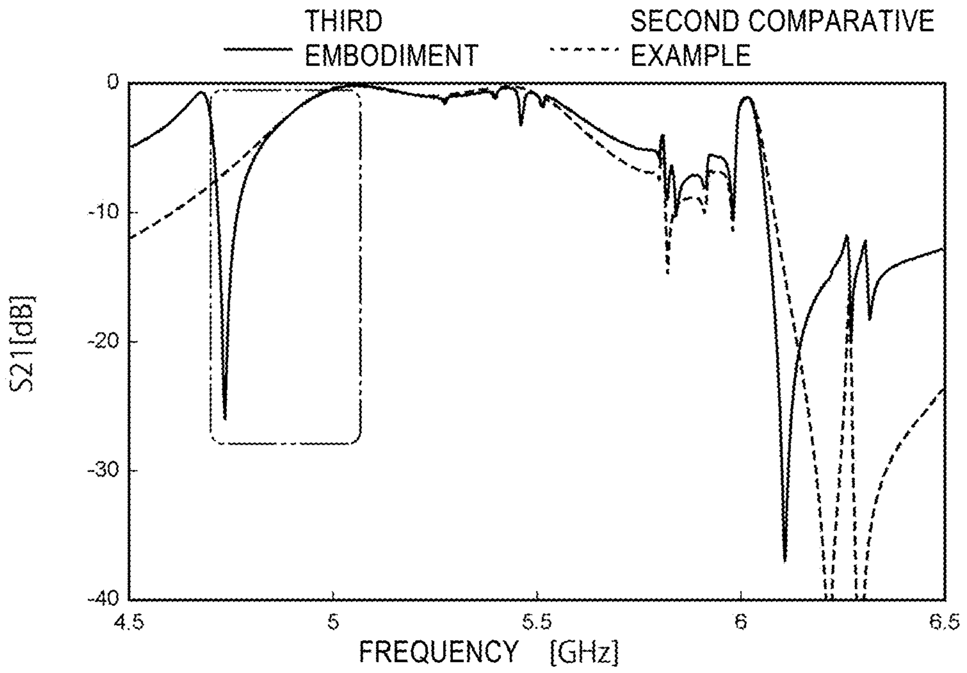
FIG. 13 is a graph illustrating bandpass characteristics of the third example embodiment of the present invention and a second comparative example.

- Piezoelectric layer
- Material: Z-cut $LiNbO_3$
- Thickness: about 400 nm
- First electrode finger, second electrode finger, and third electrode finger
- Material: Al
- Thickness: about 400 nm
- Width: about 420 nm
- Fourth electrode finger and fifth electrode finger
- Material: Al
- Thickness: about 400 nm
- Width: about 420 nm
- Center-to-center distance p1 in first acoustic wave resonator: about 1.4 μm
- Center-to-center distance p2 in second acoustic wave resonator: about 7 μm FIG. 13 is a graph illustrating bandpass characteristics of the third example embodiment and the second comparative example. FIG. 13 illustrates S21 bandpass characteristics.

As illustrated in FIG. 13, a filter waveform is suitably obtained in the third example embodiment. Therefore, when the acoustic wave device 60 is used in a filter device, a filter waveform can be suitably obtained even when the filter device includes a small number of acoustic wave resonators. This makes it possible to achieve the miniaturization of the filter device.

Furthermore, the vicinity of a low-frequency side end portion of a pass band in the third example embodiment and the second comparative example is surrounded and indicated by a two-dot chain line in FIG. 13. As illustrated in FIG. 13, in the third example embodiment, the steepness is higher near the low-frequency side end portion of the pass band, compared to the second comparative example. In this specification, high steepness means that the amount of change in frequency is small relative to the amount of change in certain attenuation near the end portion of the pass band. In the third example embodiment, the steepness as the filter characteristics can be increased.

When the second acoustic wave resonator 60B is the parallel arm resonator as in the third example embodiment illustrated in FIG. 12, it is preferable that p2>p1, and more preferable that about p2>2p1. This makes it possible to more reliably provide trap characteristics on the lower frequency side of the pass band even when the second acoustic wave resonator 60B has no frequency adjustment film. This makes it possible to more reliably increase the steepness on the lower frequency side of the pass band.

Figure 9:
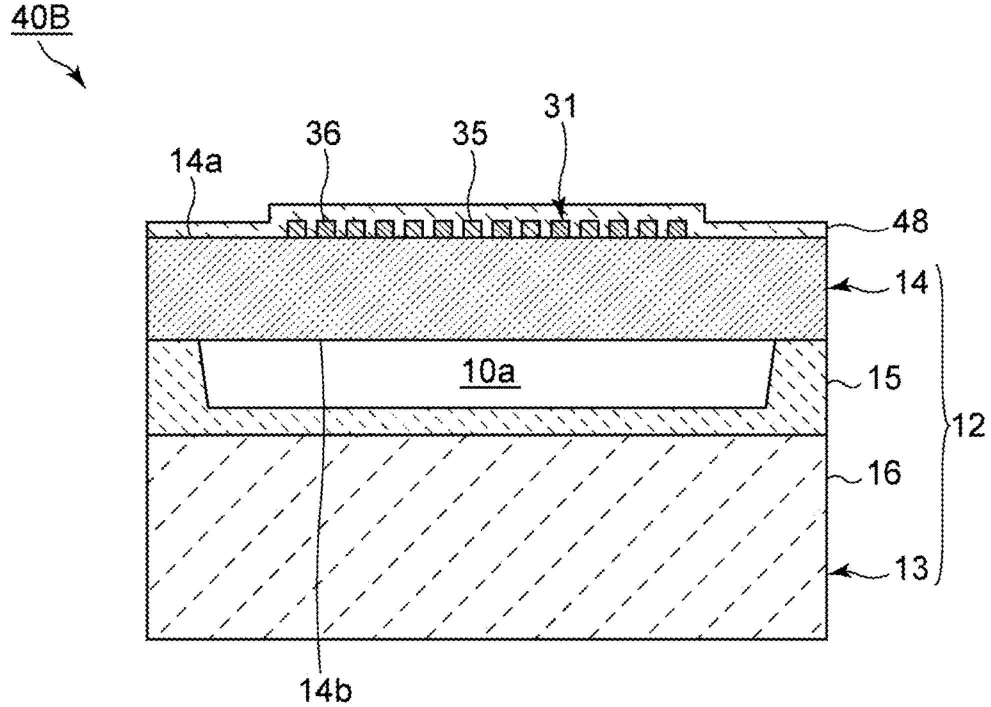
FIG. 9 is a schematic elevational cross-sectional view of a second acoustic wave resonator in a second modification of the first example embodiment of the present invention.

The second acoustic wave resonator 60B may include a frequency adjustment film 48, as in the second modification of the first example embodiment illustrated in FIG. 9. In this case, by adjusting the thickness of the frequency adjustment film 48, the trap characteristics can be more reliably provided on the lower frequency side of the pass band. This makes it possible to more reliably increase the steepness on the lower frequency side of the pass band.

In the first to third example embodiments, an example has been described where there is one first acoustic wave resonator and one second acoustic wave resonator. However, the acoustic wave device of example embodiments of the present invention may include at least one first acoustic wave resonator and at least one second acoustic wave resonator. An example where a plurality of first acoustic wave resonators and a plurality of second acoustic wave resonators are provided will be described in a fourth example embodiment of the present invention.

Figure 14:
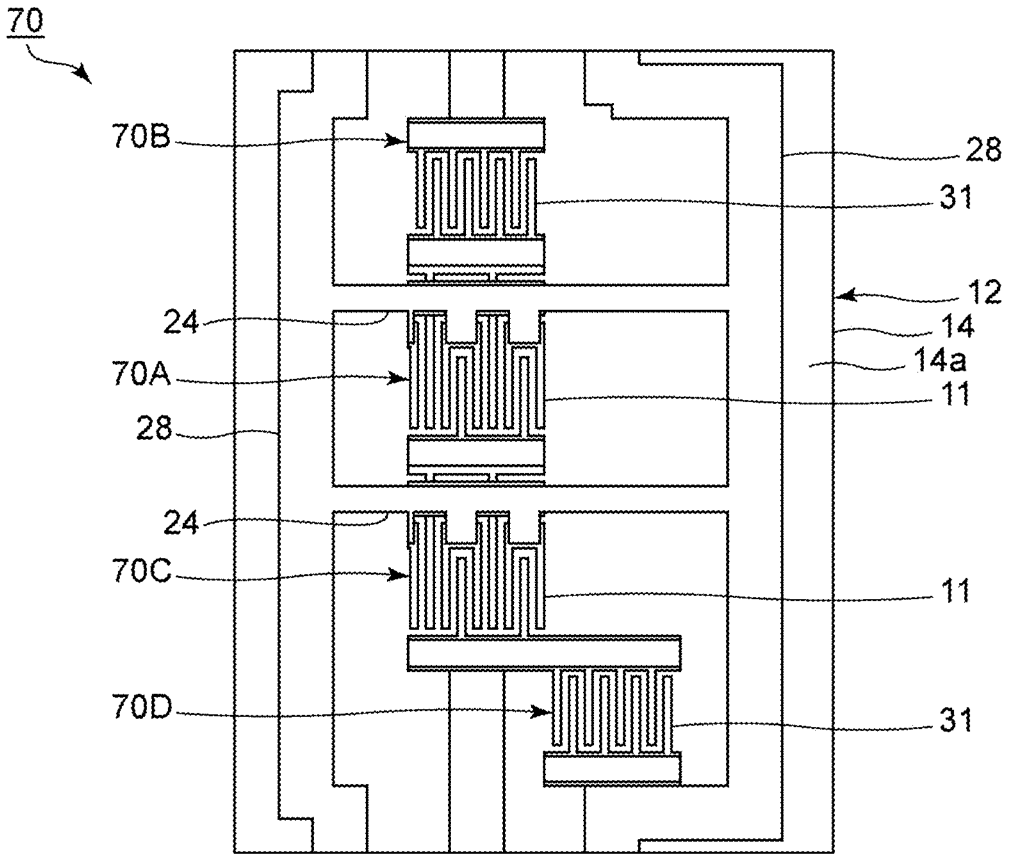
FIG. 14 is a schematic plan view of an acoustic wave device according to a fourth example embodiment of the present invention.

FIG. 14 is a schematic plan view of an acoustic wave device according to the fourth example embodiment.

An acoustic wave device 70 includes two first acoustic wave resonators 70A and 70C and two second acoustic wave resonators 70B and 70D. The first acoustic wave resonators 70A and 70C have the same or substantially the same configuration as that of the first example embodiment. However, the design parameters of the first acoustic wave resonators 70A and 70C may be different depending on the desired electrical characteristics.

The second acoustic wave resonators 70B and 70D each include an IDT electrode 31. The second acoustic wave resonator 70B is a series arm resonator. The second acoustic wave resonator 70D, on the other hand, is a parallel arm resonator. Both of the second acoustic wave resonator 70B and the second acoustic wave resonator 70D may be series arm resonators. Both of the second acoustic wave resonator 70B and the second acoustic wave resonator 70D may be parallel arm resonators.

In the acoustic wave device 70, the second acoustic wave resonator 70B, the first acoustic wave resonator 70A, and the first acoustic wave resonator 70C are connected in series with each other in this order. The second acoustic wave resonator 70D as the parallel arm resonator is connected to the first acoustic wave resonator 70C.

In the acoustic wave device 70, the connected acoustic wave resonators share a busbar. However, busbars of each of the first acoustic wave resonators and each of the second acoustic wave resonators may be individually provided.

A third busbar 24 of the first acoustic wave resonator 70A and a third busbar 24 of the first acoustic wave resonator 70C are connected to the same connection wiring 28. The busbar of the second acoustic wave resonator 70D that is not shared with the first acoustic wave resonator 70C is connected to the connection wiring 28. The connection wiring 28 is the connection wiring 28 to which the third busbar 24 is connected. The busbar of the second acoustic wave resonator 70D, the third busbar 24 of the first acoustic wave resonator 70A, and the third busbar 24 of the first acoustic wave resonator 70C are connected to a reference potential through the same connection wiring 28. However, the arrangement of the acoustic wave resonators and the connection wiring 28 in the acoustic wave device 70 is not limited to the above.

The plurality of first acoustic wave resonators and the plurality of second acoustic wave resonators in the acoustic wave device 70 share a piezoelectric substrate 12 and also share a piezoelectric layer 14. Each acoustic wave resonator may have its own piezoelectric layer. Each acoustic wave resonator may have its own piezoelectric substrate.

In the present example embodiment, as in the first example embodiment, when the acoustic wave device 70 is used in a filter device, a filter waveform can be suitably obtained even when the filter device includes a small number of acoustic wave resonators. This makes it possible to achieve the miniaturization of the filter device.

In addition, the acoustic wave device 70 includes both series arm resonators and parallel arm resonators, each including the IDT electrode 31. This makes it possible to improve the attenuation characteristics on the higher frequency side of the pass band, and to increase the steepness on the lower frequency side of the pass band.

The relationship between the center-to-center distance p2 of the second acoustic wave resonator 70B as the series arm resonator and the center-to-center distance p1 of at least one of the first acoustic wave resonator 70A and the first acoustic wave resonator 70C is, for example, preferably $p2<p1$. This makes it possible to more reliably improve the attenuation characteristics on the higher frequency side of the pass band.

The relationship between the center-to-center distance p2 of the second acoustic wave resonator 70D as the parallel arm resonator and the center-to-center distance p1 of at least one of the first acoustic wave resonator 70A and the first acoustic wave resonator 70C is, for example, preferably $p2>p1$. It is more preferable that the above relationship is, for example, $p2>2p1$. This makes it possible to more reliably increase the steepness on the lower frequency side of the pass band.

The thickness-shear mode will be described in detail below using an example where the functional electrode is an IDT electrode. The "electrode" in the IDT electrode described below corresponds to the electrode finger. A acoustic wave device in the following example is one acoustic wave resonator. A support in the following example corresponds to the support substrate. The reference potential may be hereinafter referred to as a ground potential.

Figure 15A:
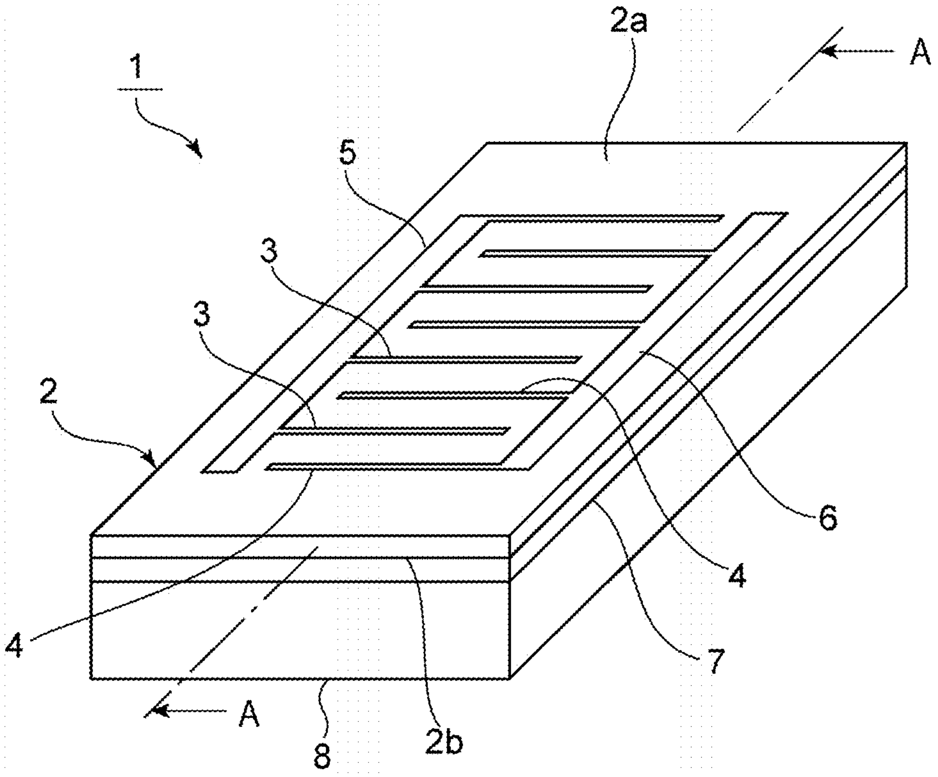
FIG. 15A is a schematic perspective view illustrating an appearance of an acoustic wave device that uses bulk waves in a thickness-shear mode.
Figure 15B:
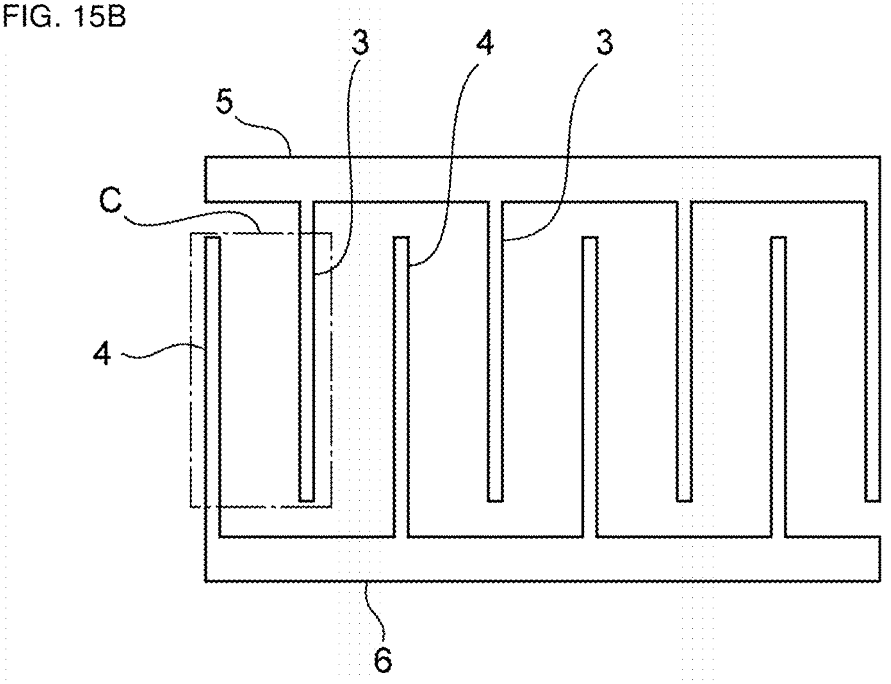
FIG. 15B is a plan view illustrating an electrode structure on a piezoelectric layer.
Figure 16:
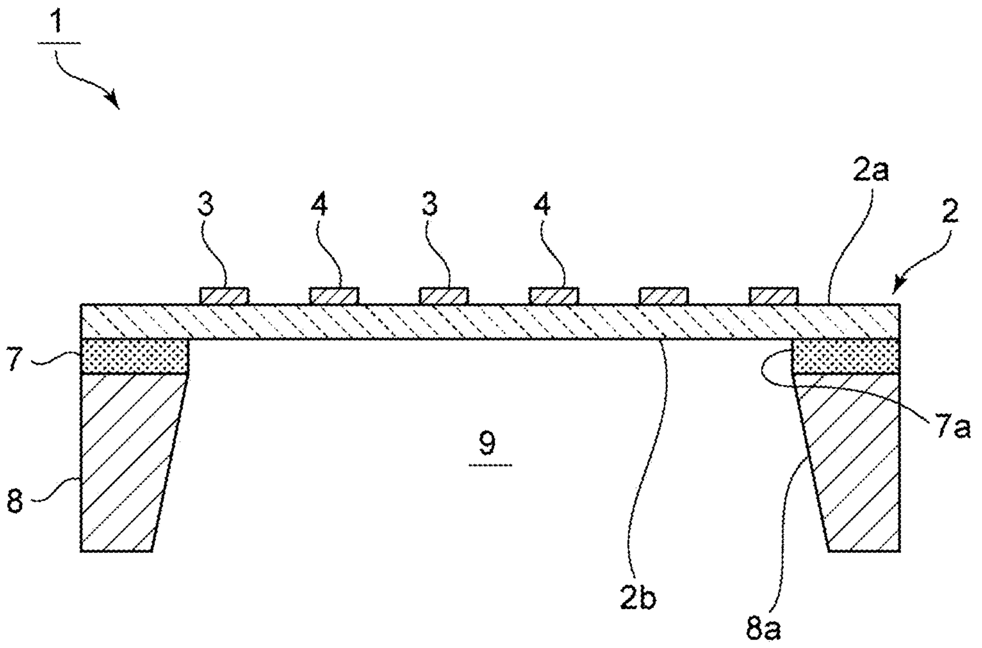
FIG. 16 is a cross-sectional view of a portion taken along line A-A in FIG. 15A.

FIG. 15A is a schematic perspective view illustrating an appearance of an acoustic wave device that uses a thickness-shear mode bulk wave. FIG. 15B is a plan view illustrating an electrode structure on a piezoelectric layer. FIG. 16 is a cross-sectional view of a portion taken along line A-A in FIG. 15A.

An acoustic wave device 1 includes a piezoelectric layer 2 made of, for example, $LiNbO_3$. The piezoelectric layer 2 may be made of, for example, $LiTaO_3$. The cut-angle of $LiNbO_3$ or $LiTaO_3$ is a Z-cut in the present example embodiment, but may be a rotated Y-cut or X-cut. The thickness of the piezoelectric layer 2 is not particularly limited, but is, for example, preferably more than or equal to about 40 nm and less than or equal to about 1000 nm, and more preferably more than or equal to about 50 nm and less than or equal to about 1000 nm in order to effectively excite a thickness-shear mode. The piezoelectric layer 2 includes a first main surface 2a and a second main surface 2b facing each other. An electrode 3 and an electrode 4 are provided on the first main surface 2a. Here, the electrode 3 is an example of a "first electrode" and the electrode 4 is an example of a "second electrode". In FIGS. 15A and 15B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrode 3 and the electrode 4 have a rectangular or substantially rectangular shape and have a length direction. In a direction orthogonal or substantially orthogonal to the length direction, the electrode 3 and the electrode 4 adjacent thereto face each other. The length direction of the electrodes 3 and 4 and the direction orthogonal or substantially orthogonal to the length direction of the electrodes 3 and 4 each are a direction intersecting a thickness direction of the piezoelectric layer 2. Therefore, it can also be said that the electrode 3 and the electrode 4 adjacent thereto face each other in the direction intersecting the thickness direction of the piezoelectric layer 2. The length direction of the electrodes 3 and 4 may be replaced with the direction orthogonal or substantially orthogonal to the length direction of the electrodes 3 and 4 illustrated in FIGS. 15A and 15B. That is, the electrodes 3 and 4 may extend in the direction in which the first busbar 5 and the second busbar 6 extend in FIGS. 15A and 15B. In this case, the first busbar 5 and the second busbar 6 extend in the direction in which the electrodes 3 and 4 extend in FIGS. 15A and 15B. A plurality of pairs of structures in which the electrode 3 connected to one potential and the electrode 4 connected to the other potential are adjacent to each other are provided in the direction orthogonal or substantially orthogonal to the length direction of the electrodes 3 and 4 described above. Here, the electrode 3 and the electrode 4 being adjacent to each other refers not to a case where the electrode 3 and the electrode 4 are arranged so as to be in direct contact with each other but to a case where the electrode 3 and the electrode 4 are arranged with an interval therebetween. When the electrode 3 and the electrode 4 are adjacent to each other, an electrode connected to a hot electrode or a ground electrode, including the other electrodes 3 and 4, is not arranged between the electrode 3 and the electrode 4. The number of pairs need not be integer pairs, but may be 1.5 pairs, 2.5 pairs, or the like. The center-to-center distance between the electrodes 3 and 4, that is, the pitch is, for example, preferably in the range of more than or equal to about 1 μm and less than or equal to about 10 μm. In addition, the width of the electrodes 3 and 4, that is, the dimension of the electrodes 3 and 4 in their facing direction, is, for example, preferably in the range of more than or equal to about 50 nm and less than or equal to about 1000 nm, and more preferably in the range of more than or equal to about 150 nm and less than or equal to about 1000 nm. The center-to-center distance between the electrodes 3 and 4 is a distance connecting the center of the dimension (width dimension) of the electrode 3 in the direction orthogonal to the length direction of the electrode 3 and the center of the dimension (width dimension) of the electrode 4 in the direction orthogonal to the length direction of the electrode 4.

In the acoustic wave device 1, since the Z-cut piezoelectric layer is used, the direction orthogonal or substantially orthogonal to the length direction of the electrodes 3 and 4 is a direction orthogonal or substantially orthogonal to the polarization direction of the piezoelectric layer 2. This does not apply when a piezoelectric body of another cut-angle is used as the piezoelectric layer 2. Here, the term "orthogonal" is not limited to strictly orthogonal but may be substantially orthogonal (an angle between the direction orthogonal to the length direction of the electrodes 3 and 4 and the polarization direction is, for example, about 90°±10°).

A support 8 is laminated on the second main surface 2*b* side of the piezoelectric layer 2 with an insulating layer 7 interposed therebetween. The insulating layer 7 and the support 8 have a frame shape and include through-holes 7*a* and 8*a* as illustrated in FIG. 16. A cavity 9 is thus provided. The cavity 9 is provided so as not to interfere with the vibration of an excitation region C of the piezoelectric layer 2. Therefore, the support 8 is laminated on the second main surface 2*b* with the insulating layer 7 interposed therebetween at a position not overlapping with a portion where at least a pair of electrodes 3 and 4 are provided. The insulating layer 7 need not be provided. Therefore, the support 8 can be directly or indirectly laminated on the second main surface 2*b* of the piezoelectric layer 2.

The insulating layer 7 is made of, for example, silicon oxide. However, the insulating layer 7 can be made of an appropriate insulating material such as, for example, silicon oxynitride or alumina in addition to silicon oxide. The support 8 is made of, for example, Si. The plane orientation of the surface of Si on the piezoelectric layer 2 side may be (100), (110), or (111). Preferably, high-resistance Si of the support 8 with a resistivity of, for example, more than or equal to about 4 kΩ cm is provided. However, the support 8 can also be made using an appropriate insulating material or semiconductor material.

Examples of the material of the support 8 include piezoelectric bodies such as aluminum oxide, lithium tantalate, lithium niobate, or quartz crystal, various ceramics such as alumina, magnesia, sapphire, silicon nitride, aluminum nitride, silicon carbide, zirconia, cordierite, mullite, steatite, or forsterite, dielectrics such as diamond or glass, semiconductors such as gallium nitride, and the like.

The plurality of electrodes 3 and 4 and the first and second busbars 5 and 6 are made of an appropriate metal or alloy such as, for example, Al or an AlCu alloy. In the acoustic wave device 1, the electrodes 3 and 4 and the first and second busbars 5 and 6 have, for example, a structure in which an Al film is laminated on a Ti film. A close contact layer other than the Ti film may be provided.

At the time of driving, an AC voltage is applied between the plurality of electrodes 3 and the plurality of electrodes 4. More specifically, an AC voltage is applied between the first busbar 5 and the second busbar 6. This makes it possible to obtain resonance characteristics using a bulk wave in the thickness-shear mode excited in the piezoelectric layer 2. In the acoustic wave device 1, d/p is, for example, less than or equal to about 0.5, where d is the thickness of the piezoelectric layer 2, and p is the center-to-center distance between any adjacent electrodes 3 and 4 of the plurality of pairs of electrodes 3 and 4. Therefore, the bulk wave in the thickness-shear mode is effectively excited, and good resonance characteristics can be obtained. More preferably, for example, d/p is less than or equal to about 0.24, in which case even better resonance characteristics can be obtained.

Since the acoustic wave device 1 has the configuration described above, even when the number of pairs of the electrodes 3 and 4 is reduced in an attempt for miniaturization, Q value is not easily reduced. This is because the propagation loss is small even if the number of electrode fingers in the reflectors on both sides is reduced. In addition, the reason why the number of electrode fingers can be reduced is that the bulk wave in the thickness-shear mode is used. The difference between a Lamb wave used in an acoustic wave device and the thickness-shear mode bulk wave described above will be described with reference to FIGS. 17A and 17B.

Figure 17A:
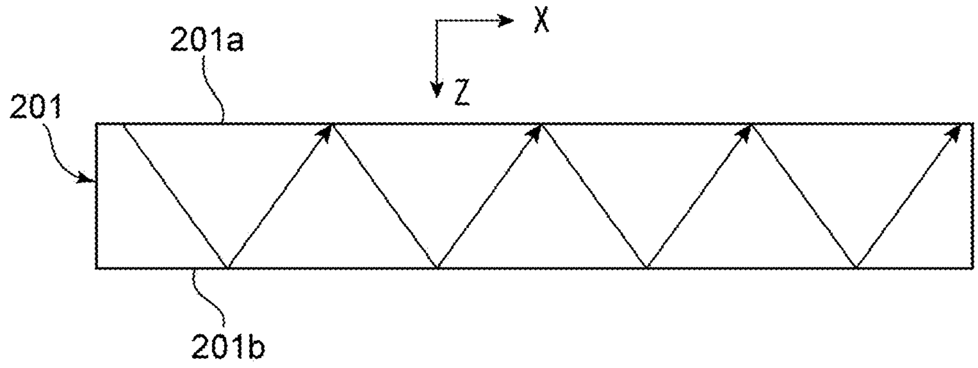
FIG. 17A is a schematic elevational cross-sectional view for explaining a Lamb wave propagating through a piezoelectric film of the acoustic wave device.

FIG. 17A is a schematic elevational cross-sectional view for explaining a Lamb wave propagating through a piezoelectric film of an acoustic wave device as described in Japanese Unexamined Patent Application Publication No. 2012-257019. As illustrated in FIG. 17A, a wave propagates through a piezoelectric film 201 as indicated by arrows. Here, the piezoelectric film 201 includes a first main surface 201*a* and a second main surface 201*b*, which face each other, and a thickness direction connecting the first main surface 201*a* and the second main surface 201*b* is the Z direction. The X direction is a direction in which electrode fingers of an IDT electrode are arranged. As illustrated in FIG. 17A, the Lamb wave propagates in the X direction. Although the piezoelectric film 201 vibrates as a whole because of the plate wave, since the wave propagates in the X direction, reflectors are arranged on both sides to obtain resonance characteristics. Therefore, a propagation loss of waves occurs, and the Q value decreases when the size is reduced, that is, when the number of pairs of electrode fingers is reduced.

Figure 17B:
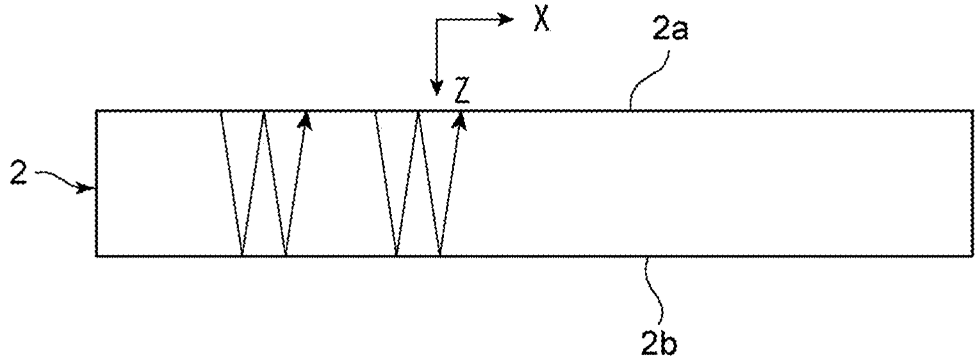
FIG. 17B is a schematic elevational cross-sectional view for explaining a bulk wave in the thickness-shear mode propagating through the piezoelectric film of the acoustic wave device.

On the other hand, as illustrated in FIG. 17B, in the acoustic wave device 1, since the vibration displacement is in the thickness-shear direction, the wave substantially propagates in the direction connecting the first main surface 2*a* and the second main surface 2*b* of the piezoelectric layer 2, that is, the Z direction, and resonates. Specifically, the X direction component of the wave is significantly smaller than the Z direction component. Since resonance characteristics are obtained by the propagation of the wave in the Z direction, propagation loss does not easily occur even when the number of electrode fingers of the reflector is reduced. Furthermore, even when the number of pairs of electrodes of the electrodes 3 and 4 is reduced in an attempt to achieve miniaturization, the Q value is not easily reduced.

Figure 18:
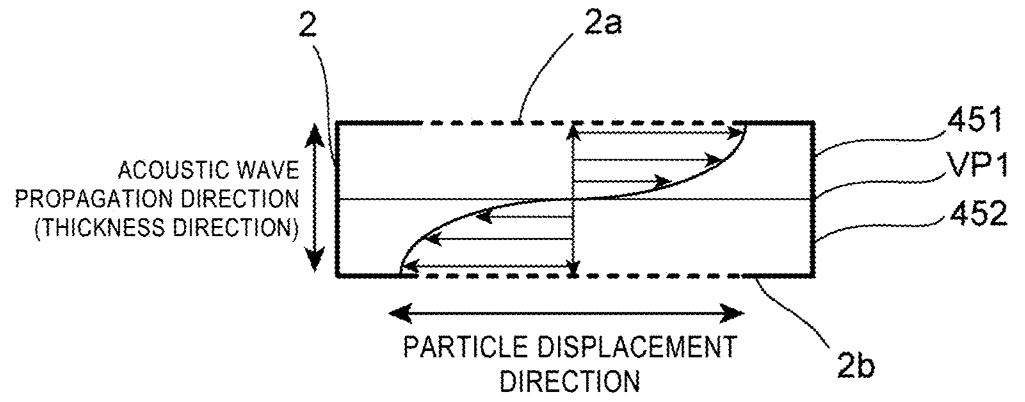
FIG. 18 is a diagram illustrating an amplitude direction of the thickness-shear mode bulk wave.

As illustrated in FIG. 18, the amplitude direction of the bulk wave in the thickness-shear mode in a first region 451 included in the excitation region C of the piezoelectric layer 2 is the opposite in a second region 452 included in the excitation region C. FIG. 18 schematically illustrates a bulk wave when a voltage is applied between the electrode 3 and the electrode 4 so that the electrode 4 has a higher potential than the electrode 3. The first region 451 is a region between the first main surface 2*a* and a virtual plane VP1 that is orthogonal or substantially orthogonal to the thickness direction of the piezoelectric layer 2 and divides the piezoelectric layer 2 into two portions in the excitation region C. The second region 452 is a region between the virtual plane VP1 and the second main surface 2*b* in the excitation region C.

As described above, in the acoustic wave device 1, at least a pair of electrodes including the electrode 3 and the electrode 4 are provided. However, since waves are not propagated in the X direction, the plurality of pairs of electrodes including the electrodes 3 and 4 are not always necessary. That is, only at least a pair of electrodes may be provided.

For example, the electrode 3 is an electrode connected to the hot potential, and the electrode 4 is an electrode connected to the ground potential. However, the electrode 3 may be connected to the ground potential and the electrode 4 may be connected to the hot potential. In the acoustic wave device 1, as described above, at least a pair of electrodes are the electrode connected to the hot potential or the electrode connected to the ground potential, and a floating electrode is not provided.

Figure 19:
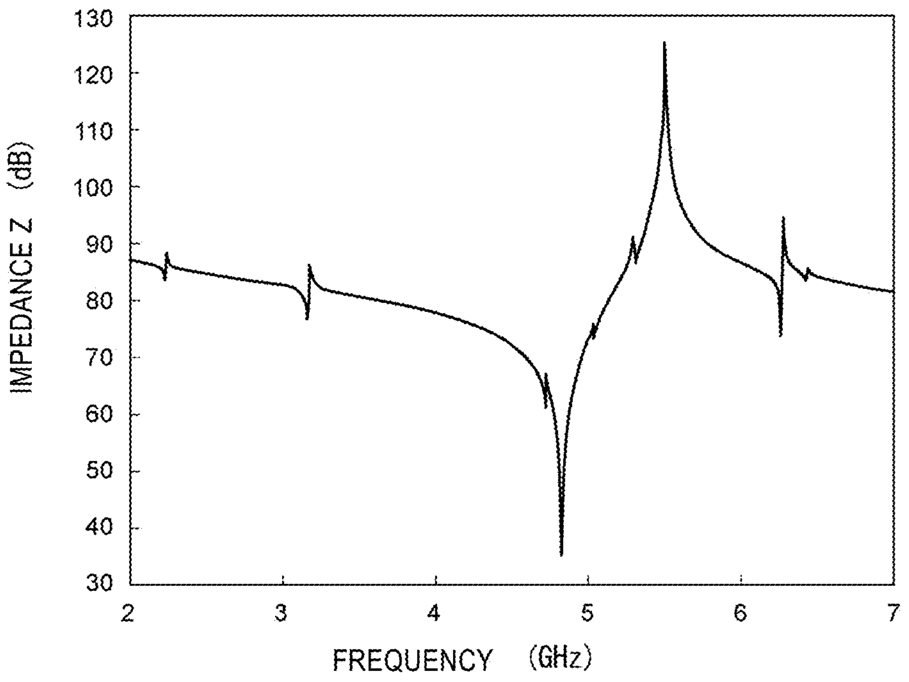
FIG. 19 is a graph illustrating resonance characteristics of the acoustic wave device using the thickness-shear mode bulk wave.

FIG. 19 is a graph illustrating resonance characteristics of the acoustic wave device illustrated in FIG. 16. The design parameters of the acoustic wave device 1 having the resonance characteristics are as follows.

Piezoelectric layer 2: $LiNbO_3$ with Euler angles (0°, 0°, 90°)

Thickness: about 400 nm

Length of region where electrodes 3 and 4 overlap as seen in direction orthogonal to length direction of electrodes 3 and 4, that is, excitation region C: about 40 μm Number of pairs of electrodes consisting of electrodes 3 and 4: 21 pairs Center-to-center distance between electrodes: about 3 μm Width of electrodes 3 and 4: about 500 nm d/p: about 0.133

Insulating layer 7: silicon oxide film with thickness of about 1 μm

Support 8: Si

The length of the excitation region C is a dimension of the excitation region C along the length direction of the electrodes 3 and 4.

In the acoustic wave device 1, the electrode-to-electrode distances of the electrode pairs including the electrodes 3 and 4 are all equal or substantially equal in the plurality of pairs. That is, the electrodes 3 and the electrodes 4 are arranged with equal or substantially equal pitches.

As is clear from FIG. 19, good resonance characteristics with the fractional band width of about 12.5% are obtained even though no reflector is provided.

As described above, in the acoustic wave device 1, d/p is, for example, less than or equal to about 0.5, and more preferably less than or equal to about 0.24, where d is the thickness of the piezoelectric layer 2 and p is the center-to-center distance between the electrode 3 and the electrode 4. This will be described with reference to FIG. 20.

Figure 20:
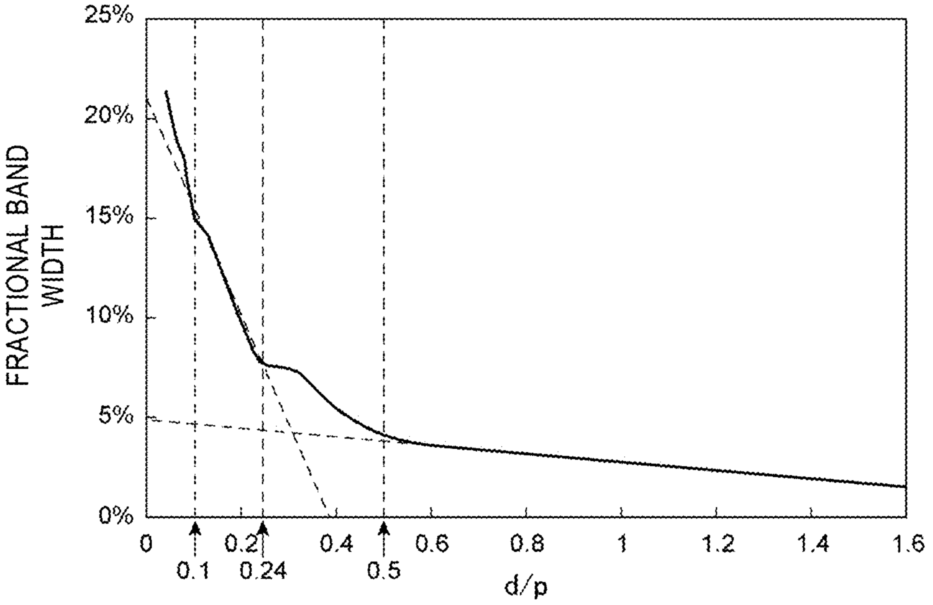
FIG. 20 is a graph illustrating a relationship between d/p and a fractional band width of a resonator, where p is the center-to-center distance between adjacent electrodes and d is the thickness of the piezoelectric layer.

A plurality of acoustic wave devices are obtained in the same or substantially the same manner as the acoustic wave device having the resonance characteristics illustrated in FIG. 19, except that d/p is changed. FIG. 20 is a graph illustrating a relationship between d/p and the fractional band width of the acoustic wave device as a resonator.

As is clear from FIG. 20, when d/p>about 0.5, the fractional band width is less than about 5% even if d/p is adjusted. On the other hand, for example, when d/p<about 0.5, the fractional band width can be set to more than or equal to about 5% by changing d/p within that range, that is, a resonator with a high coupling coefficient can be configured. Furthermore, for example, when d/p is less than or equal to about 0.24, the fractional band width can be increased to more than or equal to about 7%. In addition, by adjusting d/p within this range, a resonator with an even wider fractional band width can be obtained, and a resonator with an even higher coupling coefficient can be achieved. Therefore, it can be seen that, by setting d/p to less than or equal to, for example, about 0.5, a resonator with a high coupling coefficient can be configured using the thickness-shear mode bulk wave.

Figure 21:
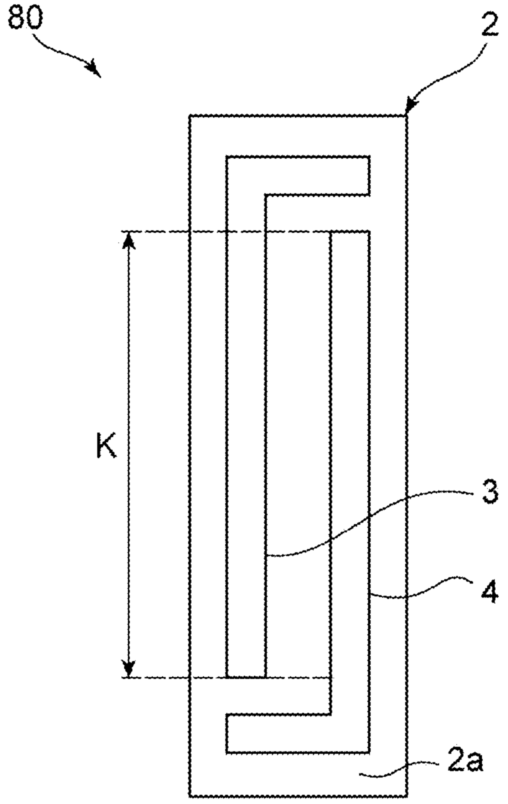
FIG. 21 is a plan view of the acoustic wave device using the thickness-shear mode bulk wave.

FIG. 21 is a plan view of an acoustic wave device that uses a thickness-shear mode bulk wave. In an acoustic wave device 80, a pair of electrodes, including an electrode 3 and an electrode 4, are provided on a first main surface 2*a* of a piezoelectric layer 2. K in FIG. 21 is an intersection width. As described above, in an acoustic wave device according to an example embodiment of the present invention, the number of pairs of electrodes may be, for example, one. Even in this case, when the d/p is less than or equal to about 0.5, the thickness-shear mode bulk wave can be effectively excited.

Figure 22:
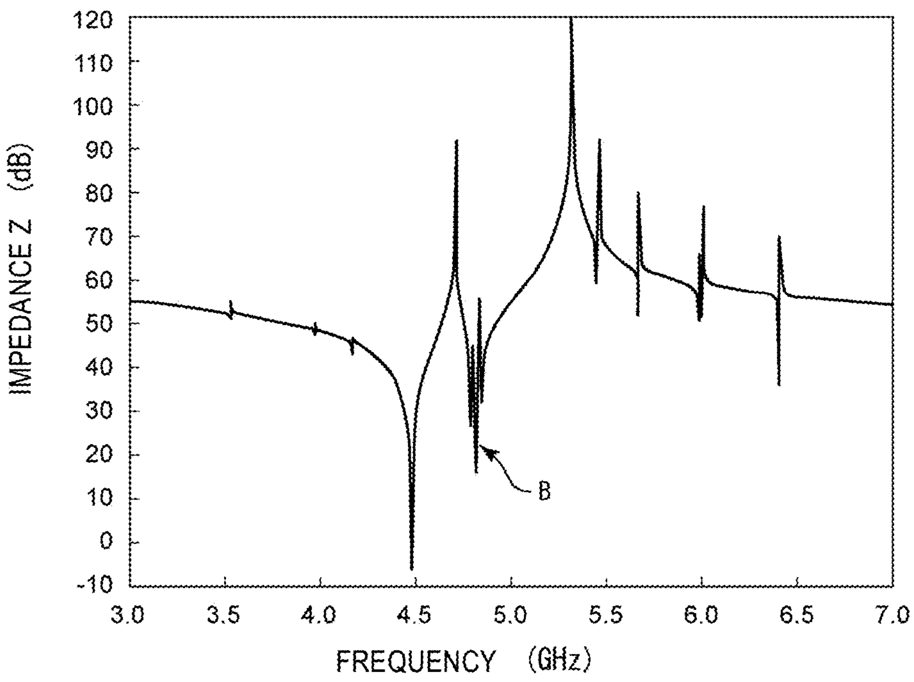
FIG. 22 is a diagram illustrating resonance characteristics of the acoustic wave device in a reference example where a spurious response appears.

In the acoustic wave device 1, for example, it is preferable that a metallization ratio MR of any adjacent electrodes 3 and 4 of the plurality of electrodes 3 and 4 with respect to the excitation region C, which is a region where the adjacent electrodes 3 and 4 overlap when viewed in their facing direction, satisfies MR≤about 1.75 (d/p)+0.075. In that case, a spurious response can be effectively reduced. This will be described with reference to FIGS. 22 and 23. FIG. 22 is a reference diagram illustrating an example of the resonance characteristics of the acoustic wave device 1. A spurious response indicated by an arrow B appears between a resonant frequency and an anti-resonant frequency. d/p=about 0.08 and the Euler angles of $LiNbO_3$ are (0°, 0°, 90°). The metallization ratio MR is about 0.35.

The metallization ratio MR will be described with reference to FIG. 15B. In the electrode structure of FIG. 15B, when focusing on a pair of electrodes 3 and 4, it is assumed that only this pair of electrodes 3 and 4 is provided. In this case, a portion surrounded by a dashed-dotted line is the excitation region C. When the electrode 3 and the electrode 4 are viewed in the direction orthogonal or substantially orthogonal to the length direction of the electrodes 3 and 4, that is, in their facing direction, the excitation region C is a region of the electrode 3 that overlaps the electrode 4, a region of the electrode 4 that overlaps the electrode 3, and a region between the electrode 3 and the electrode 4 where the electrode 3 and the electrode 4 overlap each other. An area of the electrodes 3 and 4 in the excitation region C with respect to the area of the excitation region C is the metallization ratio MR. That is, the metallization ratio MR is the ratio of the area of the metallization portion to the area of the excitation region C.

When a plurality of pairs of electrodes are provided, the ratio of the metallization portion included in the entire excitation region to the total area of the excitation region may be MR.

Figure 23:
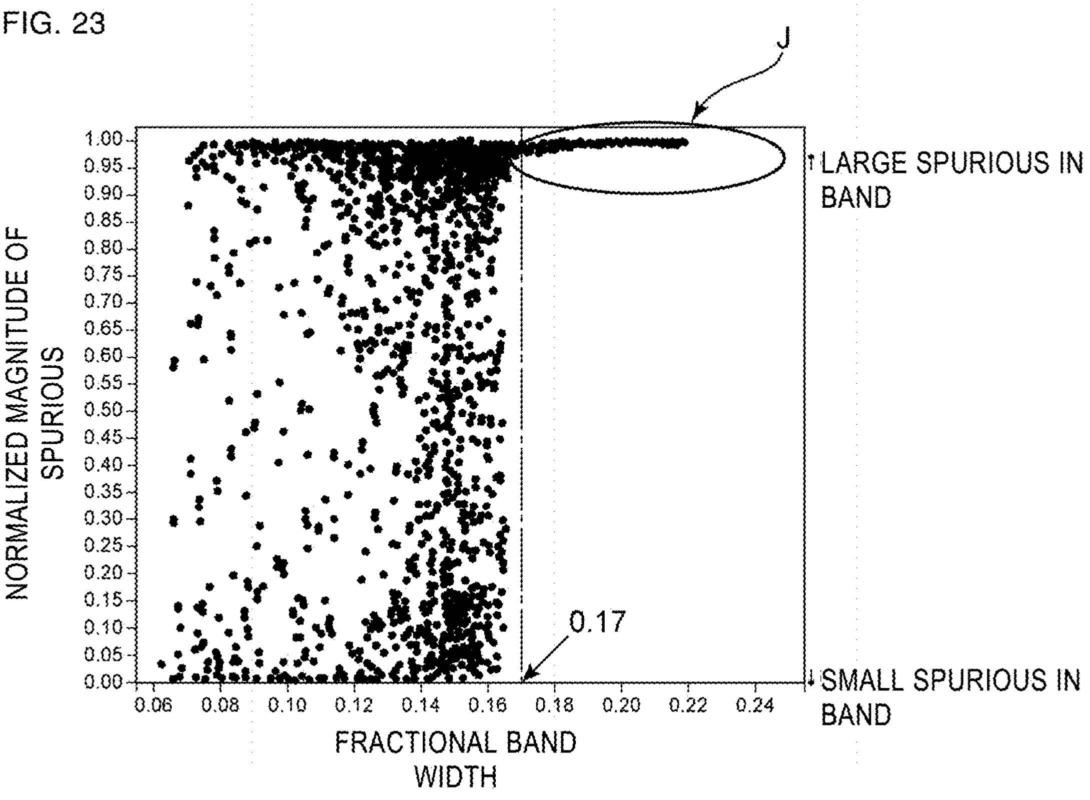
FIG. 23 is a diagram illustrating a relationship between a fractional band width and a phase rotation amount of a spurious impedance normalized by about 180 degrees as a magnitude of a spurious response.

FIG. 23 is a diagram illustrating a relationship between a fractional band width and a phase rotation amount of the spurious impedance normalized by about 180 degrees as the magnitude of the spurious when a large number of acoustic wave resonators are configured according to the configuration of the acoustic wave device 1. The fractional band width is adjusted by changing the film thickness of the piezoelectric layer and the dimensions of the electrodes. FIG. 23 illustrates the results when a Z-cut $LiNbO_3$ piezoelectric layer is used, but the same or similar tendency is obtained also when piezoelectric layers with other cut-angles are used.

In a region surrounded by an ellipse J in FIG. 23, the spurious response is as large as about 1.0. As is clear from FIG. 23, when the fractional band width exceeds about 0.17, that is, exceeds about 17%, a large spurious response with a spurious level of more than or equal to about 1 appears in a pass band even when the parameters defining the fractional band width are changed. That is, as in the resonance characteristics illustrated in FIG. 22, a large spurious response indicated by the arrow B appears within the band. Therefore, the fractional band width is, for example, preferably less than or equal to about 17%. In this case, the spurious response can be reduced by adjusting the film thickness of the piezoelectric layer 2, the dimensions of the electrodes 3 and 4, or the like.

Figure 24:
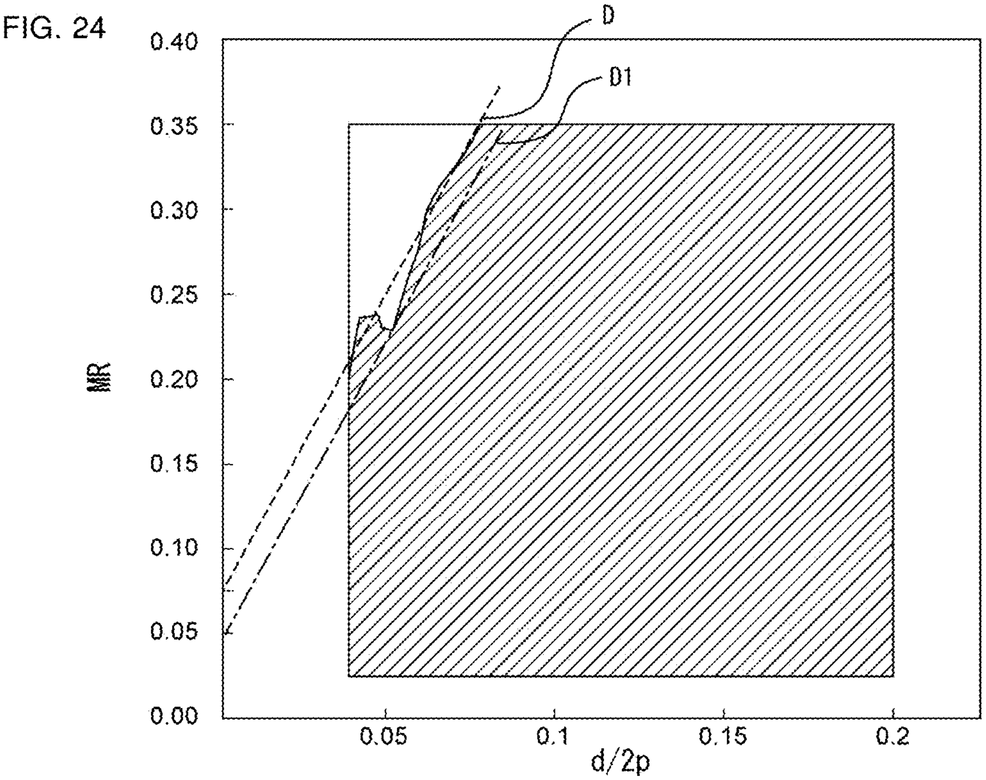
FIG. 24 is a diagram illustrating a relationship between d/2p and a metallization ratio MR.

FIG. 24 is a diagram illustrating a relationship among d/2p, the metallization ratio MR, and the fractional band width. In the acoustic wave device, various acoustic wave devices having different values of d/2p and different values of MR are provided, and the fractional band width is measured. A hatched portion to the right of a dashed line D illustrated in FIG. 24 is a region where the fractional band width is less than or equal to about 17%. The boundary between the hatched region and the non-hatched region is represented by MR=about 3.5 (d/2p)+0.075. That is, MR=about 1.75 (d/p)+0.075. Therefore, for example, MR≤about 1.75 (d/p)+0.075 is preferably satisfied. In this case, the fractional band width is easily set to less than or equal to about 17%. More preferably, for example, it is the region in FIG. 24 to the right of a dashed-dotted line D1 indicating MR=about 3.5 (d/2p)+0.05. That is, for example, when MR≤about 1.75 (d/p)+0.05, the fractional band width can be reliably set to less than or equal to about 17%.

Figure 25:
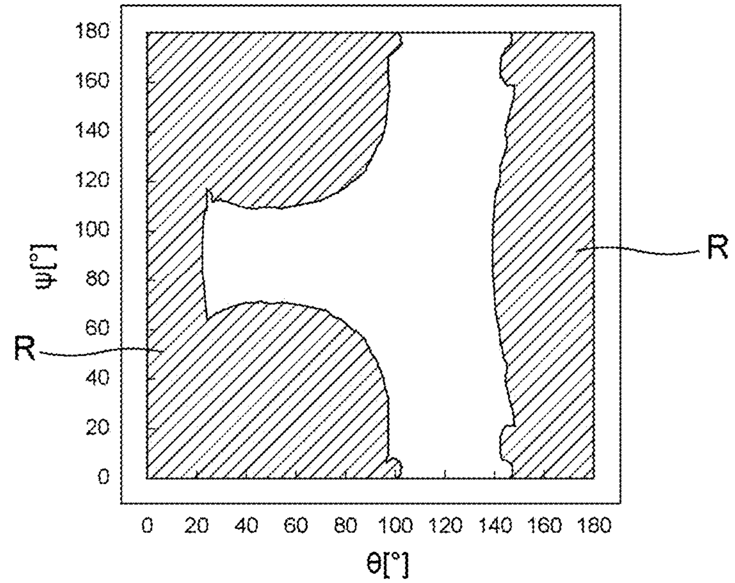
FIG. 25 is a diagram illustrating a map of the fractional band width with respect to Euler angles (0°, θ, ψ) of $LiNbO_3$ when d/p is infinitely close to 0.

FIG. 25 is a diagram illustrating a map of the fractional band width with respect to the Euler angles (0°, θ, ψ) of $LiNbO_3$ when d/p is infinitely close to 0. A plurality of hatched regions R illustrated in FIG. 25 are regions where the fractional band width of more than or equal to about 2% is obtained. When φ in the Euler angles (φ, θ, ψ) is within the range of about 0°±5°, the relationship between θ and ψ and the fractional band width is the same as that illustrated in FIG. 25. Also, for example, when the piezoelectric layer is made of lithium tantalate ($LiTaO_3$), the relationship between θ and ψ in the Euler angles (within the range of 0°±5°, θ, ψ) and BW is the same or substantially the same as that illustrated in FIG. 25.

Therefore, when φ in the Euler angles (φ, θ, ψ) of the lithium niobate or lithium tantalate of the piezoelectric layer is within the range of about 0°±5° and θ and φ are within the range of any of the regions R illustrated in FIG. 25, the fractional band width can be sufficiently widened, which is preferable.

Figure 26:
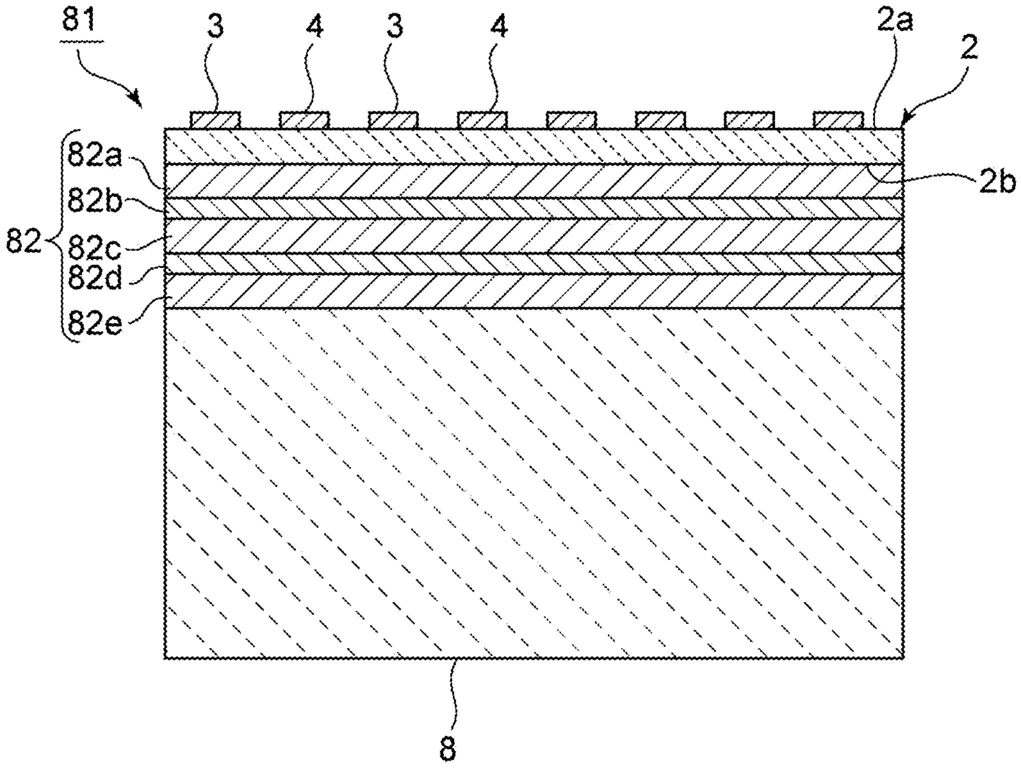
FIG. 26 is an elevational cross-sectional view of an acoustic wave device including an acoustic multilayer film.

FIG. 26 is an elevational cross-sectional view of an acoustic wave device including an acoustic multilayer film.

In an acoustic wave device 81, an acoustic multilayer film 82 is laminated on a second main surface 2*b* of a piezoelectric layer 2. The acoustic multilayer film 82 has a multilayer structure including low acoustic impedance layers 82*a*, 82*c*, and 82*e* with a relatively low acoustic impedance and high acoustic impedance layers 82*b* and 82*d* with a relatively high acoustic impedance. Using the acoustic multilayer film 82 makes it possible to confine the thickness-shear mode bulk wave in the piezoelectric layer 2 without using the cavity 9 in the acoustic wave device 1. In the acoustic wave device 81, resonance characteristics based on the thickness-shear mode bulk wave can be obtained by setting the above d/p to, for example, less than or equal to about 0.5. In the acoustic multilayer film 82, the number of the low acoustic impedance layers 82*a*, 82*c*, and 82*e* and high acoustic impedance layers 82*b* and 82*d* laminated is not particularly limited. It is sufficient that at least one high acoustic impedance layer 82*b* or 82*d* is disposed farther from the piezoelectric layer 2 than the low acoustic impedance layers 82*a*, 82*c*, and 82*e*.

The low acoustic impedance layers 82*a*, 82*c*, and 82*e* and the high acoustic impedance layers 82*b* and 82*d* can be made of any appropriate material as long as the above acoustic impedance relationship is satisfied. Examples of the material of the low acoustic impedance layers 82*a*, 82*c*, and 82*e* include silicon oxide or silicon oxynitride, and the like. Alumina, silicon nitride, metal or the like can be used as the material of the high acoustic impedance layers 82*b* and 82*d*.

Figure 27:
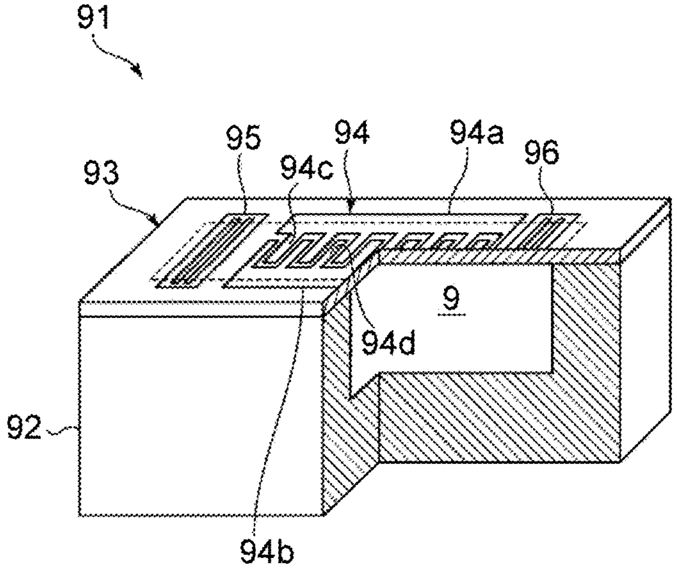
FIG. 27 is a partially cutaway perspective view for explaining an acoustic wave device that uses a Lamb wave.

FIG. 27 is a partially cutaway perspective view for explaining an acoustic wave device that uses a Lamb wave.

An acoustic wave device 91 includes a support substrate 92. The support substrate 92 is provided with a recessed portion that is open on its upper surface. A piezoelectric layer 93 is laminated on the support substrate 92. A cavity 9 is thus provided. An IDT electrode 94 is provided on the piezoelectric layer 93 above the cavity 9. On both sides of the IDT electrode 94 in the acoustic wave propagation direction, reflectors 95 and 96 are provided. In FIG. 27, an outer periphery of the cavity 9 is indicated by a dashed line. Here, the IDT electrode 94 includes first and second busbars 94*a* and 94*b*, a plurality of first electrode fingers 94*c*, and a plurality of second electrode fingers 94*d*. The plurality of first electrode fingers 94*c* are connected to the first busbar 94*a*. The plurality of second electrode fingers 94*d* are connected to the second busbar 94*b*. The plurality of first electrode fingers 94*c* and the plurality of second electrode fingers 94*d* are interdigitated with each other.

In the acoustic wave device 91, a Lamb wave as a plate wave is excited by applying an AC electric field to the IDT electrode 94 above the cavity 9. Since the reflectors 95 and 96 are provided on both sides, resonance characteristics due to the Lamb wave can be obtained.

As described above, an acoustic wave device according to an example embodiment of the present invention may use a plate wave. In the example illustrated in FIG. 27, the IDT electrode 94, the reflector 95, and the reflector 96 are provided on the main surface corresponding to the first main surface 14*a* of the piezoelectric layer 14 illustrated in FIG. 1 and the like. In the first acoustic wave resonator, on the other hand, a pair of comb-shaped electrodes and a plurality of third electrode fingers are provided on the first main surface 14*a*. When the first acoustic wave resonator uses a plate wave, a pair of comb-shaped electrodes and a plurality of third electrode fingers as well as the reflector 95 and the reflector 96 may be provided on the first main surface 14*a* of the piezoelectric layer 14 in the first to fourth example embodiments and the respective modifications. In this case, the pair of comb-shaped electrodes and the plurality of third electrode fingers may be sandwiched between the reflector 95 and the reflector 96 in the electrode finger orthogonal direction.

When the second acoustic wave resonator uses a plate wave, the IDT electrode and the reflectors 95 and 96 may be provided on the first main surface 14*a* of the piezoelectric layer 14 in the first to fourth example embodiments and the respective modifications. In this case, the IDT electrode may be sandwiched between the reflector 95 and the reflector 96 in the electrode finger orthogonal direction.

In the acoustic wave devices of the first to fourth example embodiments and the respective modifications, for example, the acoustic multilayer film 82 illustrated in FIG. 26 may be provided as an acoustic reflection film between the support and the piezoelectric layer as the piezoelectric film. Specifically, the support and the piezoelectric film may be arranged so that at least a portion of the support and at least a portion of the piezoelectric film face each other across the acoustic multilayer film 82. In this case, low acoustic impedance layers and high acoustic impedance layers may be alternately laminated in the acoustic multilayer film 82. The acoustic multilayer film 82 may define and function as an acoustic reflection portion in the acoustic wave device.

In the first acoustic wave resonator in the first to fourth example embodiments and the respective modifications that uses the thickness-shear mode bulk wave, as described above, for example, d/p is preferably less than or equal to about 0.5, and more preferably less than or equal to about 0.24. This makes it possible to obtain even better resonance characteristics. The same applies to the second acoustic wave resonator in the first to fourth example embodiments and the respective modifications that uses the thickness-shear mode bulk wave.

Furthermore, in the excitation region of the first acoustic wave resonator in the first to fourth example embodiments and the respective modifications that uses the thickness-shear mode bulk wave, for example, MR≤about 1.75 (d/p)+0.075 is preferably satisfied as described above. More specifically, for example, MR≤about 1.75 (d/p)+0.075 is preferably satisfied, where MR is the metallization ratio of the first and third electrode fingers and the second and third electrode fingers to the excitation region. In this case, a spurious response can be more reliably reduced or prevented. The same applies to the excitation region of the second acoustic wave resonator in the first to fourth example embodiments and the respective modifications that uses the thickness-shear mode bulk wave.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a first acoustic wave resonator including a first piezoelectric film including a first piezoelectric layer including a piezoelectric body; and at least one second acoustic wave resonator electrically connected to the first acoustic wave resonator and including a second piezoelectric film including a second piezoelectric layer made of a piezoelectric body and an IDT electrode on the second piezoelectric layer; wherein the first acoustic wave resonator includes:

a first comb-shaped electrode on the first piezoelectric layer, including a first busbar and a plurality of first electrode fingers each including one end connected to the first busbar, and being connected to an input potential;

a second comb-shaped electrode on the first piezoelectric layer, including a second busbar and a plurality of second electrode fingers each including one end connected to the second busbar and interdigitated with the plurality of first electrode fingers, and being connected to an output potential; and a third electrode connected to a potential different from those connected to the first comb-shaped electrode and the second comb-shaped electrode, and including a plurality of third electrode fingers on the first piezoelectric layer and aligned with the first electrode fingers and the second electrode fingers in a direction in which the first electrode fingers and the second electrode fingers are arranged in plan view, and a connection electrode connecting adjacent third electrode fingers;

an order in which a first electrode finger, a second electrode finger, and a third electrode finger are arranged is such that, starting from the first electrode finger, the first electrode finger, the third electrode finger, the second electrode finger, and the third electrode finger define one period;

the IDT electrode of the second acoustic wave resonator includes a plurality of fourth electrode fingers and a plurality of fifth electrode fingers interdigitated with each other; and the second acoustic wave resonator is a series arm resonator or a parallel arm resonator.

2. The acoustic wave device according to claim 1, further comprising:

a plurality of the second acoustic wave resonators; wherein the plurality of second acoustic wave resonators include both of the second acoustic wave resonators as series arm resonators and the second acoustic wave resonators as parallel arm resonators.

3. The acoustic wave device according to claim 2, wherein a relationship between p1 in the first acoustic wave resonator and p2 in the second acoustic wave resonator as the parallel arm resonator is p2>p1, where p1 is a center-to-center distance between adjacent first and third electrode fingers and between adjacent second and third electrode fingers in the first acoustic wave resonator, and p2 is a center-to-center distance between adjacent fourth and fifth electrode fingers in the second acoustic wave resonator.

4. The acoustic wave device according to claim 3, wherein a relationship between the p1 in the first acoustic wave resonator and the p2 in the second acoustic wave resonator as the parallel arm resonator is p2>2p1.

5. The acoustic wave device according to claim 2, wherein a relationship between p1 in the first acoustic wave resonator and p2 in the second acoustic wave resonator as the series arm resonator is p2<p1, where p1 is a center-to-center distance between adjacent first and third electrode fingers and between adjacent second and third electrode fingers in the first acoustic wave resonator, and p2 is a center-to-center distance between adjacent fourth and fifth electrode fingers in the second acoustic wave resonator.

6. The acoustic wave device according to claim 1, further comprising:

one second acoustic wave resonator; wherein the second acoustic wave resonator is a parallel arm resonator; and a relationship between p1 in the first acoustic wave resonator and p2 in the second acoustic wave resonator is p2>p1, where p1 is a center-to-center distance between adjacent first and third electrode fingers and between adjacent second and third electrode fingers in the first acoustic wave resonator, and p2 is a center-to-center distance between adjacent fourth and fifth electrode fingers in the second acoustic wave resonator.

7. The acoustic wave device according to claim 1, further comprising:

one second acoustic wave resonator; wherein the second acoustic wave resonator is a series arm resonator; and a relationship between p1 in the first acoustic wave resonator and p2 in the second acoustic wave resonator is p2<p1, where p1 is a center-to-center distance between adjacent first and third electrode fingers and between adjacent second and third electrode fingers in the first acoustic wave resonator, and p2 is a center-to-center distance between adjacent fourth and fifth electrode fingers in the second acoustic wave resonator.

8. The acoustic wave device according to claim 1, wherein the first piezoelectric layer and the second piezoelectric layer are a same piezoelectric layer, and the first acoustic wave resonator and the at least one second acoustic wave resonator share a same piezoelectric layer.

9. The acoustic wave device according to claim 1, wherein the first acoustic wave resonator is structured to generate a thickness-shear mode bulk wave.

10. The acoustic wave device according to claim 1, wherein the first acoustic wave resonator further includes a support laminated on the first piezoelectric film;

an acoustic reflection portion is provided at a position on the support overlapping with the plurality of first electrode fingers, the plurality of second electrode fingers, and the plurality of third electrode fingers in plan view along a lamination direction of the support and the first piezoelectric film; and d/p is less than or equal to about 0.5, where p is a longest distance of a center-to-center distance between adjacent first and third electrode fingers and a center-to-center distance between adjacent second and third electrode fingers in the first acoustic wave resonator, and d is a thickness of the first piezoelectric film.

11. The acoustic wave device according to claim 10, wherein d/p is less than or equal to about 0.24.

12. The acoustic wave device according to claim 10, wherein the acoustic reflection portion includes a cavity, and a portion of the support and a portion of the first piezoelectric film face each other across the cavity.

13. The acoustic wave device according to claim 10, wherein the acoustic reflection portion is an acoustic reflection film including a high acoustic impedance layer with a relatively high acoustic impedance and a low acoustic impedance layer with a relatively low acoustic impedance; and at least a portion of the support and at least a portion of the first piezoelectric film face each other across the acoustic reflection film.

14. The acoustic wave device according to claim 10, wherein an excitation region is a region where the adjacent first and third electrode fingers overlap each other in an electrode finger orthogonal direction orthogonal or substantially orthogonal to a direction in which the first electrode finger, the second electrode finger, and the third electrode finger extend; and a region between centers of the adjacent first and third electrode fingers, and a region where the adjacent second and third electrode fingers overlap each other in the electrode finger orthogonal direction and a region between centers of the adjacent second and third electrode fingers; and MR≤about 1.75 (d/p)+0.075 is satisfied, where MR is a metallization ratio of the first electrode fingers and the third electrode fingers, and the second electrode fingers and the third electrode fingers to the excitation region.

15. The acoustic wave device according to claim 10, wherein the support includes a support substrate and an insulating layer.

16. The acoustic wave device according to claim 15, wherein the support substrate includes silicon or aluminum.

17. The acoustic wave device according to claim 15, wherein the insulating layer includes silicon oxide or tantalum oxide.

18. The acoustic wave device according to claim 15, wherein the insulating layer includes a recess portion.

19. The acoustic wave device according to claim 1, wherein the first piezoelectric layer is made of lithium niobate and Euler angles (φ, θ, ψ) of the lithium niobate of the first piezoelectric layer are within a range of Expression (1), Expression (2), or Expression (3):

$$\text{(within the range of } 0°\pm10°,\ 0° \text{ to } 25°, \text{ any } \psi) \qquad \text{Expression (1)}$$

$$\text{(within the range of } 0°\pm10°, 25° \text{ to } 100°, 0° \text{ to } 75°[(1-(\theta-50)^2/2500)]^{1/2} \text{ or } 180°-75°[(1-(\theta-50)^2/2500)]^{1/2} \text{ to } 180°) \qquad \text{Expression (2)}$$

$$\text{(within the range of } 0°\pm10°, 180°-40°[(1-(\psi-90)^2/8100)]^{1/2} \text{ to } 180°, \text{ any } \psi) \qquad \text{Expression (3)}$$

* * * * *